(12) United States Patent
Yamasaki et al.

(10) Patent No.: US 6,846,711 B2
(45) Date of Patent: Jan. 25, 2005

(54) METHOD OF MAKING A METAL OXIDE CAPACITOR, INCLUDING A BARRIER FILM

(75) Inventors: Hideaki Yamasaki, Yamanashi (JP); Yumiko Kawano, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 4 days.

(21) Appl. No.: 09/794,046

(22) Filed: Feb. 28, 2001

(65) Prior Publication Data

US 2001/0020715 A1 Sep. 13, 2001

(30) Foreign Application Priority Data

Mar. 2, 2000 (JP) ........................................ 2000-057128
Jul. 14, 2000 (JP) ........................................ 2000-215022
Sep. 18, 2000 (JP) ........................................ 2000-282716

(51) Int. Cl.[7] ........................................ H01L 21/8242
(52) U.S. Cl. ........................ 438/240; 438/244; 438/250
(58) Field of Search .............................. 438/210, 239, 438/240, 243, 244, 250, 387, 396, 618, 622, 623, 627, 628, 643, 648

(56) References Cited

U.S. PATENT DOCUMENTS

| | | | | |
|---|---|---|---|---|
| 5,414,301 A | * | 5/1995 | Thomas ........................ | 257/740 |
| 6,190,965 B1 | * | 2/2001 | Clampitt ...................... | 438/255 |
| 6,239,461 B1 | * | 5/2001 | Lee .............................. | 257/306 |
| 6,245,580 B1 | * | 6/2001 | Solayappan et al. ............ | 438/3 |
| 6,319,765 B1 | * | 11/2001 | Cho et al. .................... | 438/240 |
| 6,326,258 B1 | * | 12/2001 | Iizuka ......................... | 438/239 |
| 6,326,315 B1 | * | 12/2001 | Uchiyama et al. ........... | 438/758 |
| 6,342,425 B1 | * | 1/2002 | Joo .............................. | 438/396 |
| 6,348,402 B1 | * | 2/2002 | Kawanoue et al. .......... | 438/618 |
| 6,403,414 B2 | * | 6/2002 | Marsh ......................... | 438/239 |

OTHER PUBLICATIONS

K. Ono et al. "(Ba, Sr) TiO₃ Capacitor Technology for Gbit–Scale DRAMs" IEDM Tech. Dig., (4 pages), (1998).
Jun Lin et al. "Achievement of tungsten films by annéaling tungsten nitride covered with SiO₂ top layer" Proc. of Advanced Metallization Conference, (2 pages), (1997).

* cited by examiner

*Primary Examiner*—Eddie Lee
*Assistant Examiner*—Douglas W. Owens
(74) *Attorney, Agent, or Firm*—Finnegan, Henderson, Farabow, Garrett & Dunner LLP

(57) ABSTRACT

A semiconductor device includes an interlevel insulating film, a contact plug, a barrier film, a first electrode, a capacitor insulating file, and a second electrode. The interlevel insulating film is formed on a semiconductor substrate. The contact plug extends through the interlevel insulating film and is formed from a conductive material. The barrier film is formed from a tungsten-based material on the upper surface of the contact plug. The first electrode is connected to the contact plug via the barrier film and formed from a metal material on the interlevel insulating film. The capacitor insulating film is formed from an insulating metal oxide on the first electrode. The second electrode is insulated by the capacitor insulating film and formed on the surface of the first electrode.

6 Claims, 18 Drawing Sheets

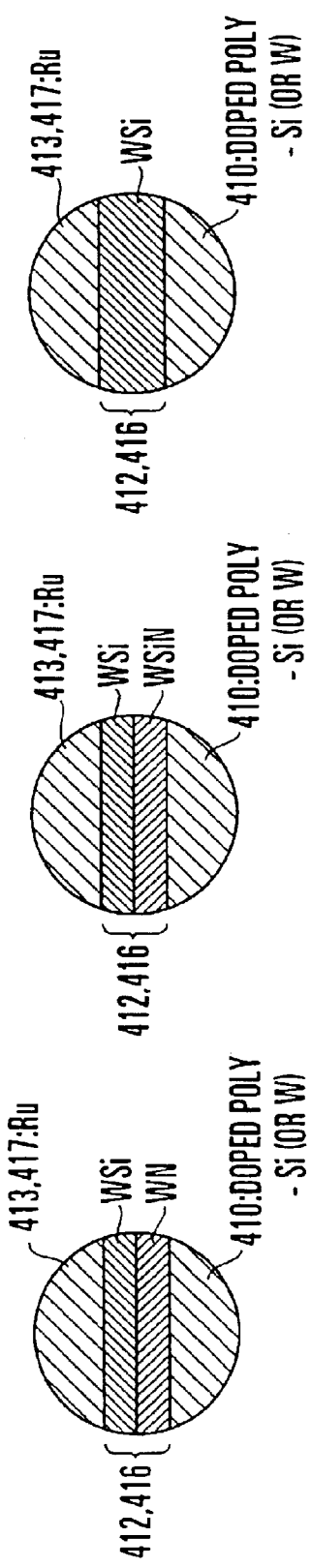
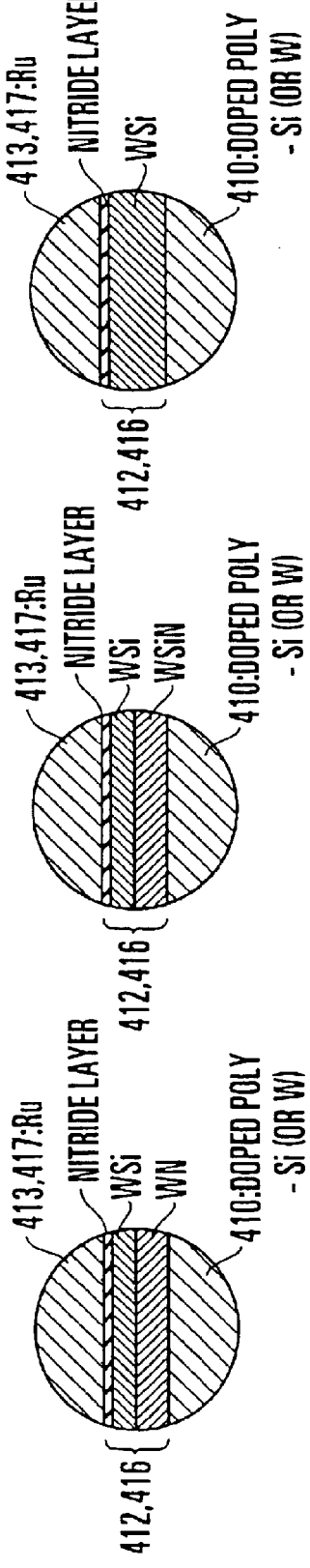
FIG.5A FIG.5B FIG.5C
FIG.5D FIG.5E FIG.5F
※ (a)~(c) : ONLY BARRIER FILM.
   (d)~(f) : BARRIER FILM+NITRIDE LAYER

US 6,846,711 B2

METHOD OF MAKING A METAL OXIDE CAPACITOR, INCLUDING A BARRIER FILM

BACKGROUND OF THE INVENTION

The present invention relates to a semiconductor device having a capacitor using a metal oxide film as a dielectric film, and a manufacturing method therefor.

As the integration degree of an integrated circuit is increasing, demands have arisen for an increase in memory capacity by decreasing the memory cell area in a DRAM (Dynamic Random Access Memory) made up of one transistor and one capacitor. To meet these demands, there is proposed a technique of increasing the capacity without increasing the memory cell area by using a material such as tantalum oxide ($Ta_2O_5$) having a high permittivity for a dielectric film which forms the capacitor.

When a material having a higher permittivity, e.g., tantalum oxide is used as a dielectric film, a desired permittivity is obtained by forming a tantalum oxide film and performing post-processing such as annealing and plasma processing. At this time, post-processing is generally done in an oxygen-containing atmosphere in order to prevent elimination of oxygen from the dielectric material as an oxide. For this reason, tungsten or titanium nitride used for a storage electrode oxidizes. A metal material such as gold, platinum, or ruthenium which hardly oxidizes or exhibits conductivity even upon oxidization is used.

A DRAM using such a dielectric film will be explained by exemplifying a stacked memory cell.

As shown in FIG. 10, a gate electrode 1004 is formed via a gate insulating film 1003 in a region defined by an element isolation region 1002 on a semiconductor substrate 1001. Source and drain regions 1005a and 1005b are formed on the two sides of the gate electrode 1004 on the semiconductor substrate 1001 by forming impurity regions by ion implantation using the gate electrode 1004 as a mask. The gate electrode 1004, gate insulating film 1003, and source and drain regions 1005a and 1005b constitute one transistor TR.

An interlevel insulating film 1006 is formed on the gate electrode 1004 in the entire region of the semiconductor substrate 1001. A contact plug 1007 connected to the drain region 1005b formed in the semiconductor substrate 1001 is formed at a predetermined position in the interlevel insulating film 1006. A bit line 1008 connected to the contact plug 1007 is formed.

An interlevel insulating film 1009 is formed on the interlevel insulating film 1006 including the bit line 1008. A contact plug 1010 connected to the source region 1005a formed in the semiconductor substrate 1001 extends through the interlevel insulating films 1009 and 1006.

A stacked ruthenium storage electrode 1011 is formed on the contact plug 1010.

A capacitor insulating film 1012 is formed on the storage electrode 1011 to cover it, and a plate electrode 1013 is formed on the capacitor insulating film 1012.

In this structure, one memory cell is constituted by the transistor TR having the gate electrode 1004, and a capacitor made up of the storage electrode 1011, capacitor insulating film 1012, and plate electrode 1013 connected to the transistor.

An interlevel insulating film 1014 of an insulator is formed on the interlevel insulating film 1009 including the plate electrode 1013. Although not shown, an interconnection layer connected to the bit line 1008 and plate electrode 1013 is formed on the interlevel insulating film 1014.

In this semiconductor device, a contact plug connected to a silicon substrate generally uses heat-resistant doped polysilicon or a refractory metal such as tungsten.

In the conventional structure, high-temperature processing is performed in an oxygen atmosphere after forming the capacitor insulating film in order to attain a desired permittivity.

In high-temperature processing in an oxygen atmosphere, oxygen readily permeates through the ruthenium storage electrode. This oxidizes the surface of the contact plug, forms a capacitance at the interface between the storage electrode and the contact plug, and increases the resistance.

SUMMARY OF THE INVENTION

It is a principal object of the present invention to provide a semiconductor device in which a contact plug is connected at a low resistance to the storage electrode of a capacitor having a capacitor insulating film made of a metal oxide, and a manufacturing method therefor.

To achieve the above object, the present inventors adopt a barrier film between an electrode constituting a capacitor and the contact plug of a transistor connected to this electrode, and use a tungsten-based material for the barrier film.

To achieve the above object, according to an aspect of the present invention, there is provided a semiconductor device comprising an interlevel insulating film formed on a semiconductor substrate, a contact plug which extends through the interlevel insulating film and is formed from a conductive material, a barrier film which is formed from a tungsten-based material on an upper surface of the contact plug, a first electrode which is connected to the contact plug via the barrier film and formed from a metal material on the interlevel insulating film, a capacitor insulating film which is formed from an insulating metal oxide on the first electrode, and a second electrode which is insulated by the capacitor insulating film and formed on a surface of the first electrode.

BRIEF DESCRIPTION OF THE DRAWINGS

FIGS. 5A to 5F are sectional views showing barrier films in FIGS. 4A and 4B in detail;

DESCRIPTION OF THE PREFERRED EMBODIMENTS

Preferred embodiments of the present invention will be described below.

(First Embodiment)

The first embodiment of the present invention will be described with reference to FIGS. 1A to 1K. A stacked memory cell will be exemplified.

Figure 1A:
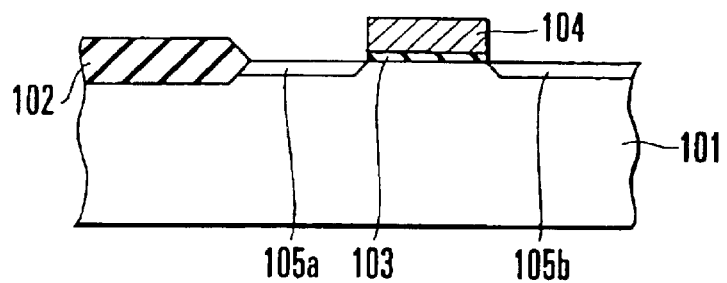
FIGS. 1A to 1K are sectional views showing a semiconductor device and manufacturing method therefor according to the first embodiment of the present invention.

As shown in FIG. 1A, a gate electrode 104 is formed by a known method via a gate insulating film 103 in a region defined by an element isolation region 102 on a silicon substrate 101. After the gate electrode 104 is formed, source and drain regions 105a and 105b are formed by ion implantation or the like using the gate electrode 104 as a mask. Note that the source and drain regions 105a and 105b are specified diffusion regions and may be exchanged. The source and drain regions 105a and 105b, gate insulating film 103, and gate electrode 104 constitute a transistor TR.

Figure 1B:
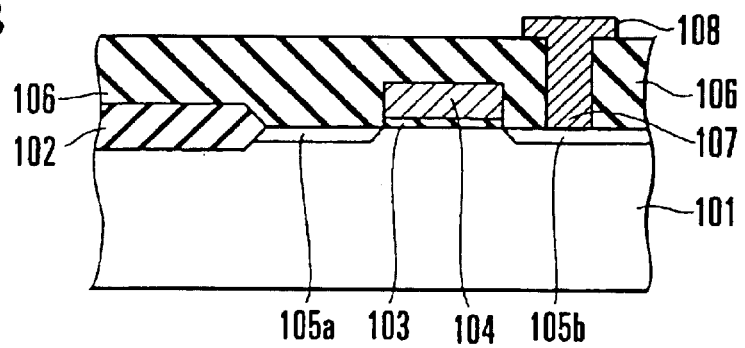

As shown in FIG. 1B, an interlevel insulating film 106 of an insulator such as silicon oxide is formed in the entire region of the silicon substrate 101. A contact plug 107 is formed at a predetermined position so as to connect it to the drain region 105b formed in the silicon substrate 101. A bit line 108 is formed and connected to the contact plug 107.

Figure 1C:
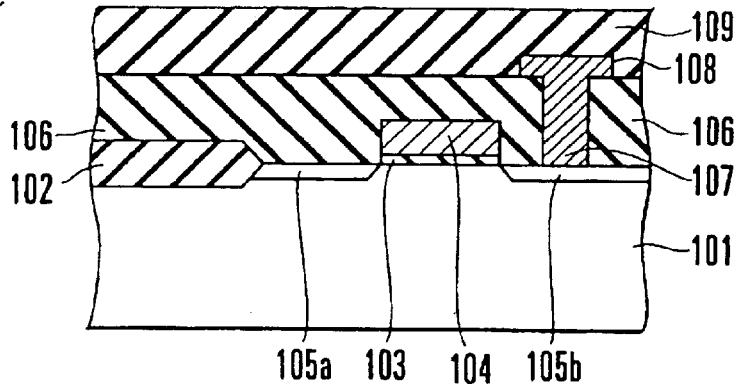
Figure 1D:
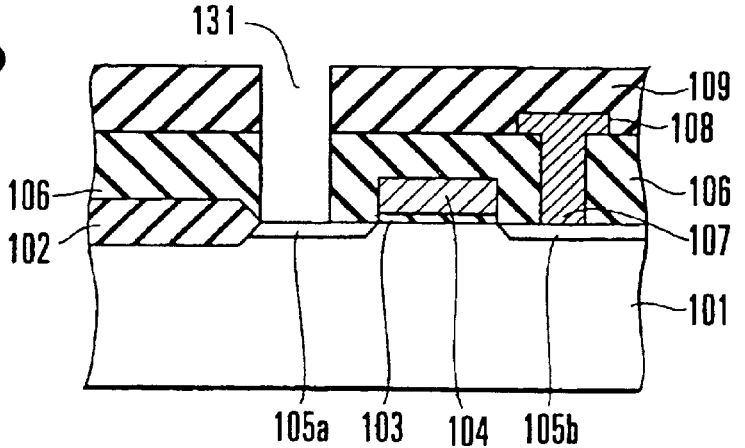

As shown in FIG. 1C, an interlevel insulating film 109 of an insulator such as silicon oxide is formed on the interlevel insulating film 106 including the bit line 108. As shown in FIG. 1D, a contact plug hole 131 is formed in the interlevel insulating films 109 and 106 by known photolithography and etching so as to reach the source region 105a.

Figure 1E:
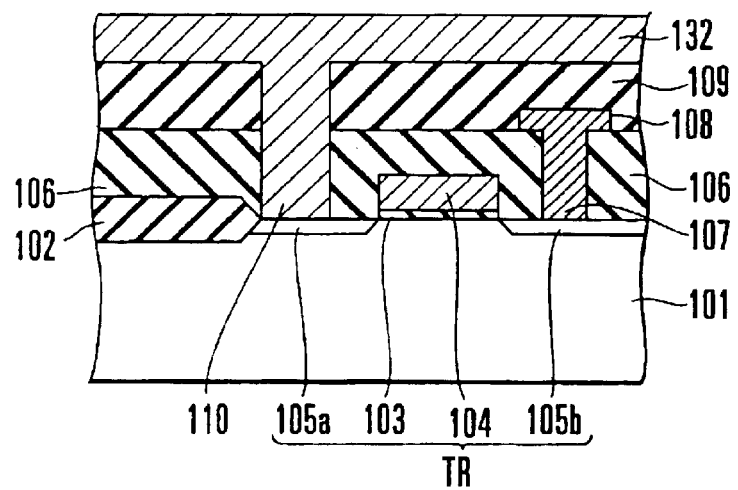
Figure 1F:
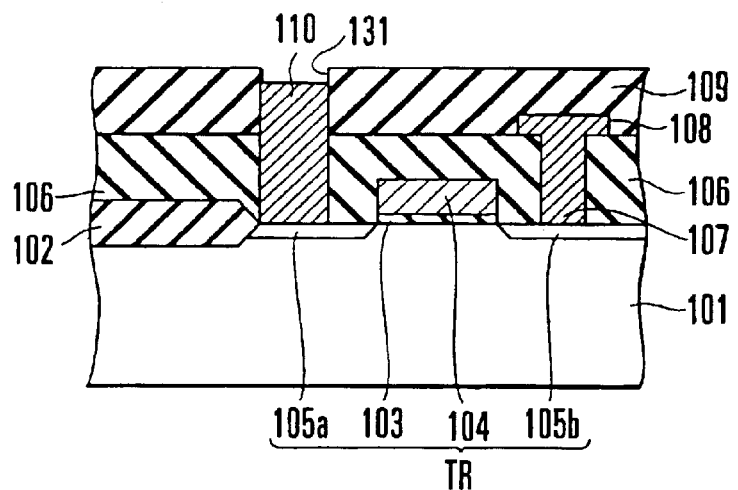

As shown in FIG. 1E, a doped polysilicon film 132 is formed by depositing doped polysilicon on the interlevel insulating film 109 so as to fill the contact plug hole 131. Deposition of doped polysilicon uses, e.g., CVD.

The doped polysilicon film 132 is selectively etched back to form a doped polysilicon contact plug 110 in the contact plug hole 131 while keeping a space to a certain degree at the upper portion of the contact plug hole 131. Selective etch-back of the doped polysilicon film 132 adopts reactive dry etching using an etching gas which has selectivity with respect to silicon and hardly etches the interlevel insulating film 106.

Figure 1G:
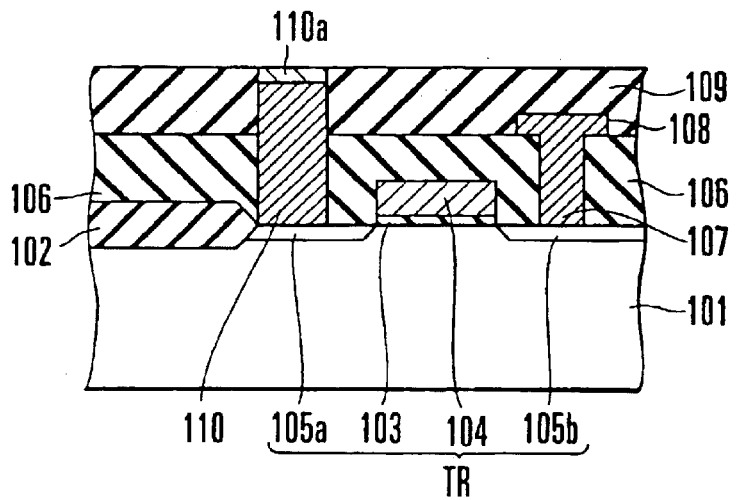

A tungsten nitride film is deposited to a film thickness of about 50 to 100 nm so as to fill the space above the contact plug 110 in the contact plug hole 131, and processed to form a barrier film 110a to a film thickness of about 20 nm so as to cover the entire upper surface of the contact plug 110, as shown in FIG. 1G.

The barrier film 110a is formed as follows. A tungsten nitride film is formed on the interlevel insulating film 109 by thermal CVD (Chemical Vapor Deposition) so as to fill the space above the contact plug 110. Film formation of tungsten nitride by thermal CVD uses a substrate temperature of about 500° C., $WF_6$ gas as a tungsten source gas, and $NH_3$ gas as a nitrogen source gas.

This film formation method with good step coverage enables uniformly filling a small space above the contact plug 110 with the tungsten nitride film even when the contact plug hole 131 has a small hole diameter of 0.15 μm or less. The adhesion properties between the surface of the contact plug 110 and the formed tungsten nitride film can be improved by supplying only the tungsten source gas ($WF_6$) onto the target substrate heated to a predetermined temperature in the initial stage in forming the tungsten nitride film.

The deposited film is etched back by a predetermined amount by, e.g., CMP (Chemical Mechanical Polishing) to leave the barrier film 110a on the contact plug 110, as shown in FIG. 1G. At this time, the upper surface of the barrier film 110a is flush with that of the interlevel insulating film 109.

Figure 1H:
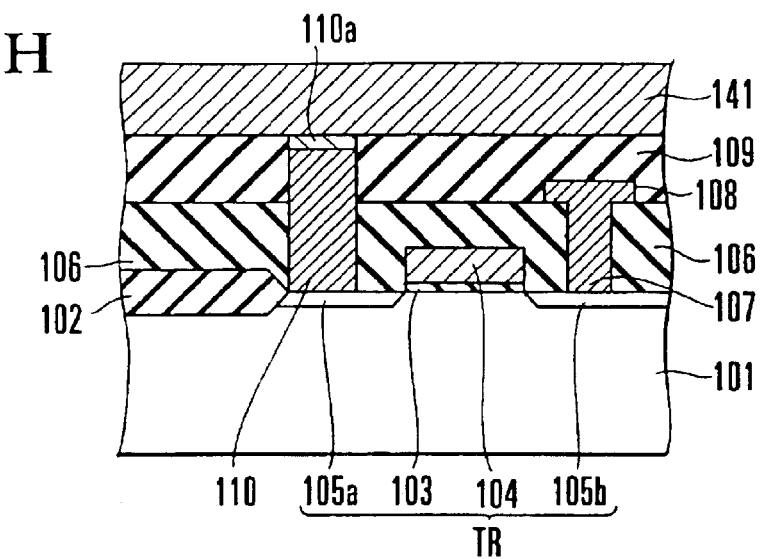

As shown in FIG. 1H, a ruthenium metal film 141 is formed to a film thickness of about 20 to 50 nm on the interlevel insulating film 109 including the barrier film 110a by spattering, CVD, or the like.

Figure 1I:
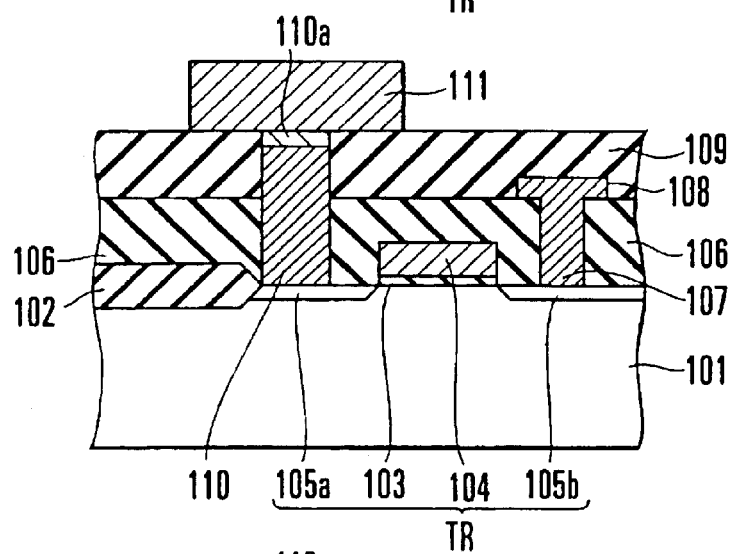

As shown in FIG. 1I, a storage electrode (first electrode) 111 connected to the contact plug 110 via the barrier film 110a is formed on the interlevel insulating film 109 by patterning the metal film 141 by known photolithography and etching. The storage electrode 111 may use gold or platinum other than ruthenium.

Figure 1J:
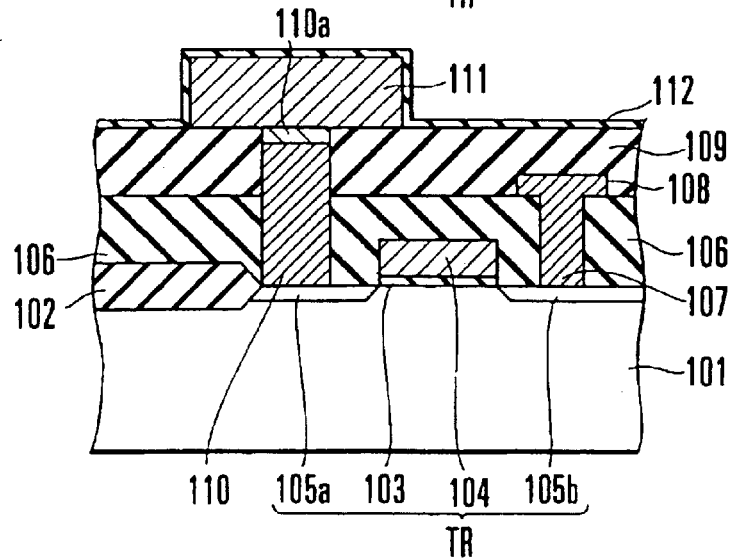

A tantalum oxide film is formed to a film thickness of about 5 to 15 nm on the interlevel insulating film 109 so as to cover the storage electrode 111, and subjected to post-processing such as annealing in an oxygen atmosphere at a temperature of about 500 to 750° C. Accordingly, a capacitor insulating film 112 is formed, as shown in FIG. 1J.

Even if annealing in the oxygen atmosphere is performed, the first embodiment can prevent oxygen in the atmosphere from permeating through the barrier film 110a though oxygen permeates through the storage electrode 111, and can prevent the surface of the contact plug 110 from oxidizing, because the tungsten nitride barrier film 110a is on the contact plug 110. Note that the capacitor insulating film is not limited to tantalum oxide but may use another metal oxide.

Figure 1K:
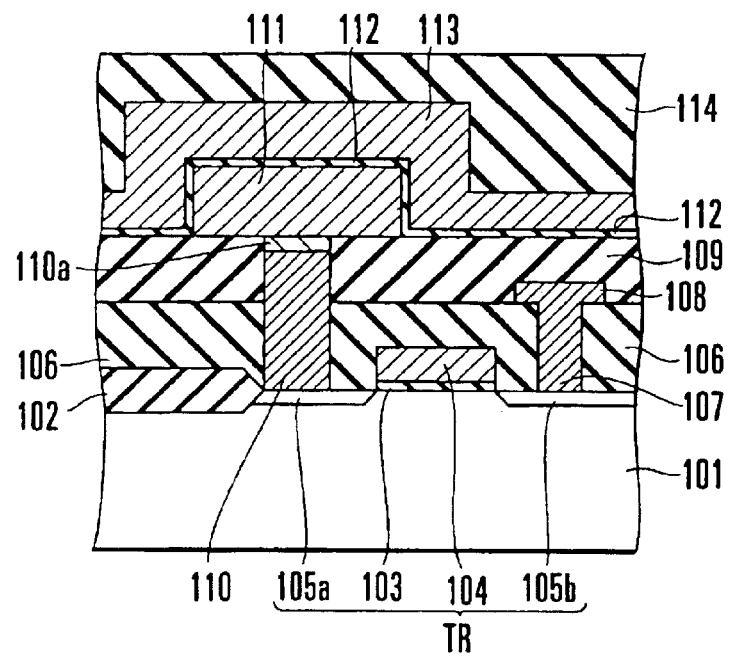

A film of titanium nitride or tungsten nitride or a metal film of ruthenium or the like is formed to a film thickness of about 10 to 100 nm on the capacitor insulating film 112. The formed metal film is patterned by known lithography and etching to form a plate electrode (second electrode) 113, as shown in FIG. 1K.

An interlevel insulating film 114 made of an insulating material such as a silicon oxide is formed to cover the plate electrode 113. Accordingly, a DRAM with one transistor and one capacitor is completed.

The capacitor electrode is flat in the first embodiment, but is not limited to this and may have a cylindrical shape or stacked electrode structure. For a cylindrical capacitor electrode, a plate electrode, capacitor insulating film, storage electrode, capacitor insulating film, and plate electrode are sequentially formed from the outside on the side surface. For a stacked electrode structure, a storage electrode may be arranged on the uppermost layer.

(Second Embodiment)

The second embodiment of the present invention will be described.

In the first embodiment, the barrier film 110a is formed from a one-layered tungsten nitride film. However, the barrier film is not limited to this and may have a two-layered structure by adding a tungsten suicide layer or silicon nitride layer. The two-layered structure improves the oxygen barrier properties of the barrier film, and further enhances anti-oxidant action.

Figure 2A:
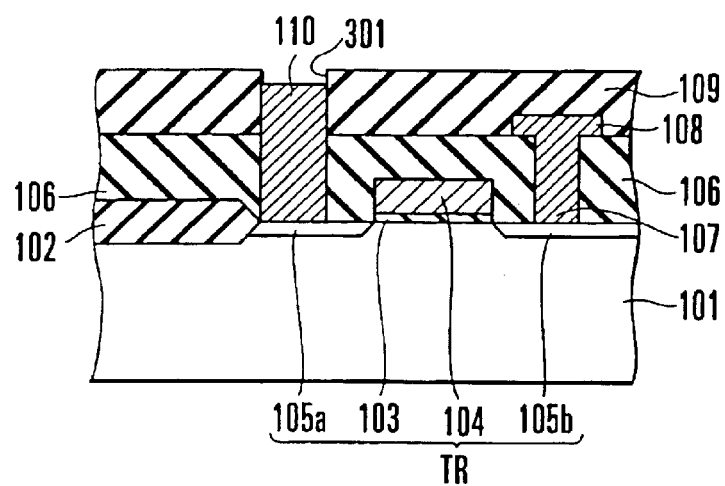
FIGS. 2A to 2F are sectional views, respectively, showing the steps according to the second embodiment of the present invention.

Steps up to formation of a contact plug when the barrier film is formed from two layers are the same as the steps shown in FIGS. 1A to 1F. A description of steps up to formation of a contact plug will be omitted. A description of the second embodiment starts from a state wherein a contact plug 110 is formed, as shown in FIG. 2A.

Figure 2B:
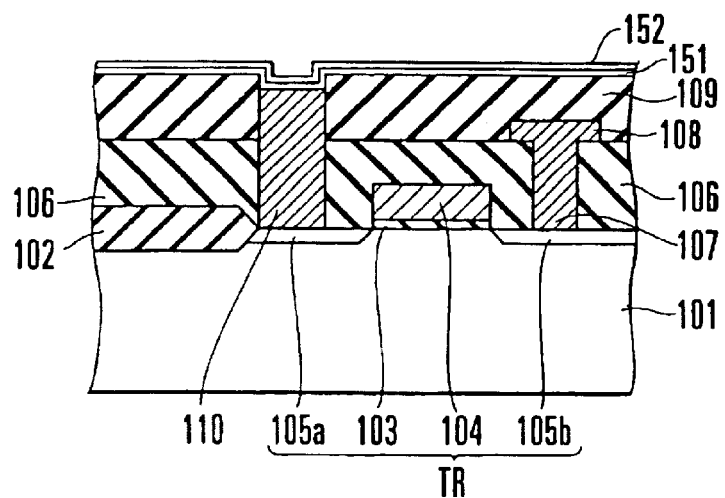

After a contact plug 110 connected to a transistor is formed on a silicon substrate 101, a tungsten nitride film 151 having a film thickness of about 10 nm and a tungsten suicide film 152 having a film thickness of about 10 nm are sequentially formed on an interlevel insulating film 109 including the upper portion of the contact plug 110, as shown in FIG. 2B in the second embodiment. These films are formed as follows.

The tungsten nitride film 151 is formed on the interlevel insulating film 109 by thermal CVD so as to fill a space above the contact plug 110. Film formation by thermal CVD uses a substrate temperature of about 500° C., $WF_6$ gas as a tungsten source gas, and $NH_3$ gas as a nitrogen source gas. Subsequently, $SiH_4$ gas as a silicon source gas is supplied together with $WF_6$ gas instead of $NH_3$ gas, and the tungsten silicide film 152 is formed on the tungsten nitride film 151.

Figure 2C:
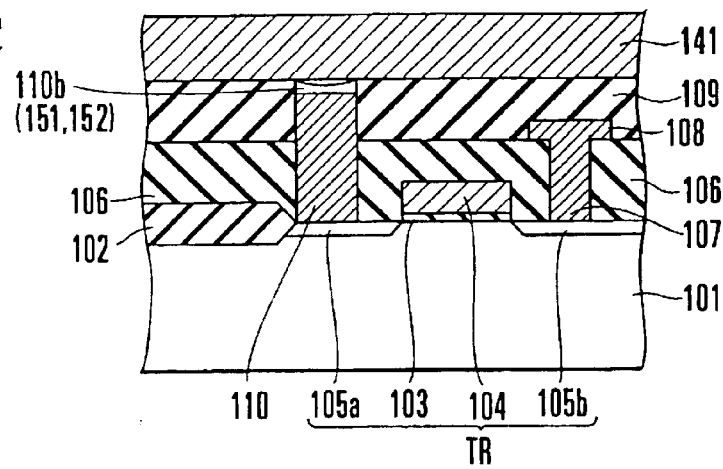
Figure 2D:
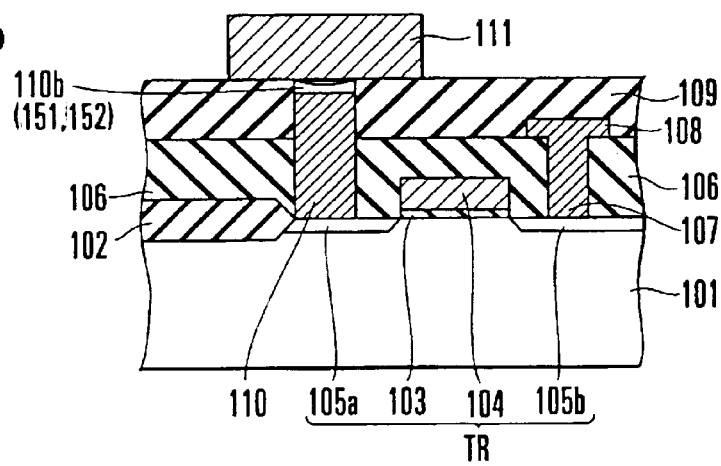

The deposited film is etched back by a predetermined amount by, e.g., CMP (Chemical Mechanical Polishing) to leave a two-layered barrier film 110b of the tungsten nitride film and tungsten silicide film on the contact plug 110, as shown in FIG. 2C. A ruthenium metal film 141 is formed to a film thickness of about 20 to 50 nm on the interlevel insulating film 109 including the barrier film 110b by sputtering, CVD, or the like. As shown in FIG. 2D, a storage electrode 111 connected to the contact plug 110 via the barrier film 110b is formed on the interlevel insulating film 109 by patterning the metal film 141 by known photolithography and etching.

Figure 2E:
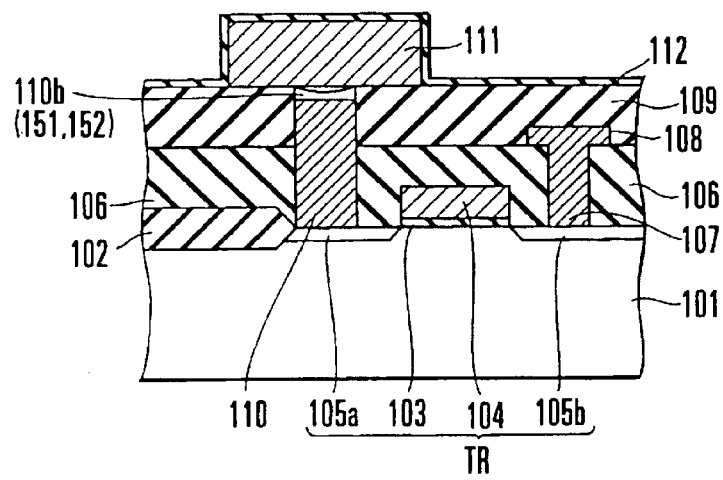

A tantalum oxide film is formed to a film thickness of about 5 to 15 nm on the interlevel insulating film 109 so as to cover the storage electrode 111, and undergoes post-processing such as annealing in an oxygen atmosphere at a temperature of about 500 to 750° C. As a result, a capacitor insulating film 112 is formed, as shown in FIG. 2E. Even if annealing in the oxygen atmosphere is executed, the second embodiment can prevent oxygen in the atmosphere from permeating through the barrier film 110b though oxygen permeates through the storage electrode 111, and can prevent the surface of the contact plug 110 from oxidizing, because the two-layered barrier film 110b of the tungsten nitride film and tungsten silicide film is on the contact plug 110.

Figure 2F:
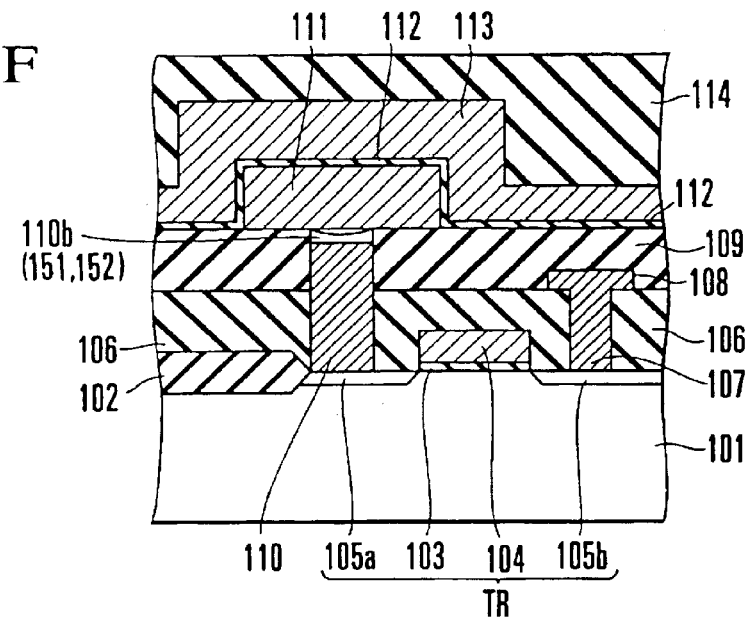

A film of titanium nitride or tungsten nitride or a metal film of ruthenium or the like is formed to a film thickness of about 10 to 100 nm on the capacitor insulating film 112. This metal film is patterned by known lithography and etching to form a plate electrode 113, as shown in FIG. 2F.

An interlevel insulating film 114 made of an insulating material such as a silicon oxide is formed to cover the plate electrode 113. Resultantly, a DRAM with one transistor and one capacitor is completed.

In the second embodiment, the barrier film attains a two-layered structure by forming a tungsten silicide film on a tungsten nitride film. Alternatively, the barrier film may attain a two-layered structure by forming a silicon nitride film on a tungsten nitride film. The silicon nitride film is formed on the tungsten nitride film by thermal CVD using $SiH_4$ gas as a silicon source gas and $NH_3$ gas as a nitrogen source gas.

Figure 3:
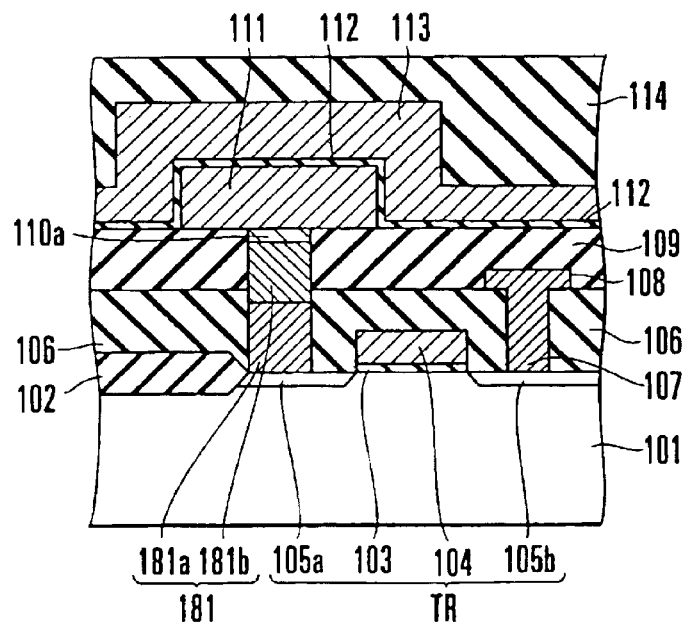
FIG. 3 is a schematic sectional view showing a semiconductor device according to the second embodiment of the present invention.

The above-described embodiments adopt a doped polysilicon contact plug, However, the present invention is not limited to this and can be similarly applied to a tungsten contact plug. When tungsten is used, a contact plug 181 is constituted by a lower contact plug 181a of doped polysilicon and an upper contact plug 181b of tungsten, as shown in FIG. 3. To form the contact plug from tungsten, tungsten is filled in a small contact plug hole. Since the burying properties of tungsten by thermal CVD are poor, the contact plug hole is filled to a certain level by doped polysilicon, and the contact plug is constituted by two layers, as described above. The remaining structure in FIG. 3 is the same as in the above embodiments.

When tungsten is used for the contact plug, the contact plug adopts a three-layered structure of a lower tungsten nitride layer, intermediate tungsten layer, and upper tungsten silicide layer. Formation of the three-layered contact plug will be briefly described. After doped polysilicon is filled to a predetermined level in the contact plug hole, a tungsten nitride film, tungsten film, and tungsten silicide film serving as a barrier film are successively formed. In this case, the tungsten nitride film is inserted between the doped polysilicon film and the tungsten film in order to prevent an increase in resistance or a change in shape caused by reaction between doped polysilicon and tungsten. This intermediate tungsten nitride film may be omitted as far as the reaction can be suppressed to a negligible degree by appropriately setting the film formation temperature or the like. To the contrary, a tungsten nitride film may be inserted between the tungsten film and the tungsten silicide film in order to more strictly prevent oxidization of tungsten.

The successively formed films are etched back by a predetermined amount by CMP, thereby simultaneously forming a tungsten contact plug at the upper portion of the contact plug hole and a barrier film on the upper surface of the contact plug. This method can decrease the number of steps, compared to a case wherein a contact plug and barrier film are separately formed.

The tungsten contact plug and overlying barrier film can be simultaneously formed by forming the contact plug in this manner, but the barrier film does not cover the entire upper surface of the contact plug. In this case, the periphery of the upper surface of the contact plug is exposed without being covered with the barrier film. The barrier film need not cover the entire upper surface of the contact plug, and suffices to cover the upper surface of the contact plug to a certain degree, which can solve a problem caused by oxidizing the entire upper surface of the contact plug. For example, if the barrier film covers about 80% of the upper surface of the contact plug, a region below the barrier film is not oxidized, conductivity can be ensured, and swell caused by oxidization of the periphery of the contact plug can also be suppressed to a given degree.

As described above, according to the present invention, an electrode is connected to a contact plug via a barrier film made of tungsten nitride as a tungsten-based material, and the barrier film suppresses entry of oxygen into the contact plug. The present invention exhibits excellent effects of suppressing formation of an oxide film on the surface of the contact plug after the barrier film is formed, and connecting the contact plug to the electrode at a low resistance.

(Third Embodiment)

The third embodiment of the present invention will be described.

Figure 4A:
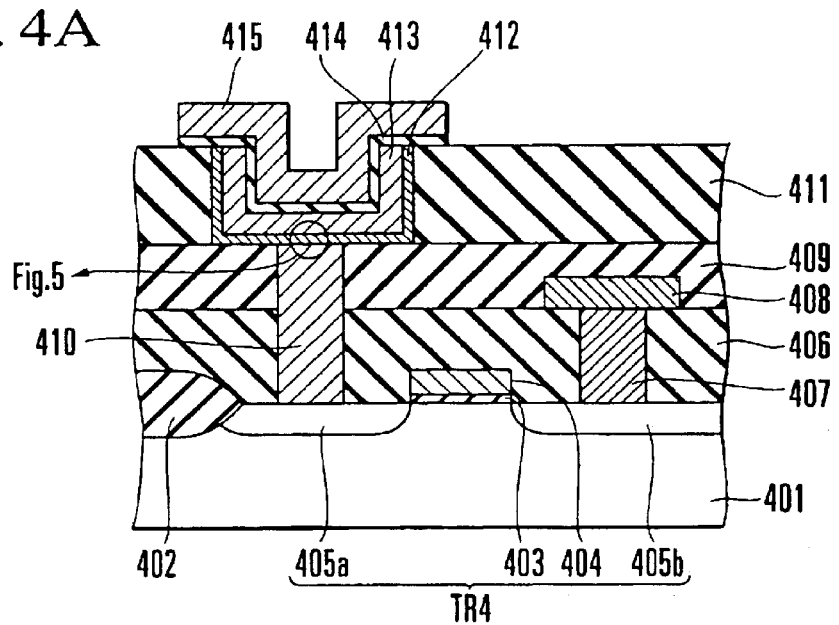
FIGS. 4A and 4B are sectional views showing the third embodiment of the present invention.
Figure 4B:
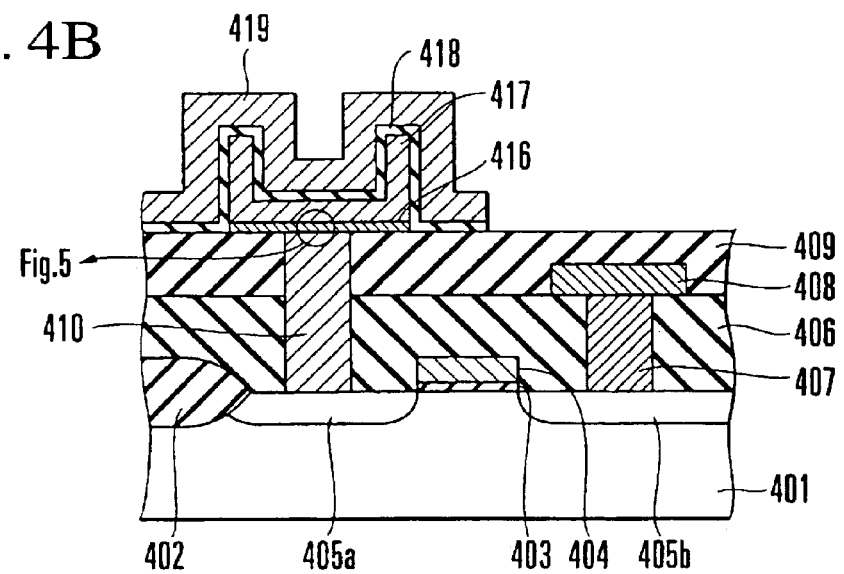

FIGS. 4A and 4B show a semiconductor device according to the third embodiment of the present invention. As shown in FIG. 4A, a transistor TR4 comprised of source and drain regions 405a and 405b, a gate oxide film 403, and a gate electrode 404 is formed on the major surface of a semiconductor substrate (silicon substrate 401 in this case). The transistor TR4 is separated from adjacent transistors (not shown) by a field oxide film 402.

The major surface of the silicon substrate 401 is covered with an interlevel insulating film 406, and a doped polysilicon contact plug 407 is buried in a contact hole formed in the interlevel insulating film 406. The contact plug 407 is electrically connected to the drain region 405b and an interconnection 408 on the interlevel insulating film 406.

An interlevel insulating film 409 is stacked on the interlevel insulating film 406, and a doped polysilicon contact plug 410 is buried in a contact hole formed in the interlevel insulating films 406 and 409. The contact plug 410 is electrically connected to the source region 405a and a storage electrode 413 via a barrier film 412 on the interlevel insulating film 409. The storage electrode 413 is a concave electrode and is made of a platinum group metal such as ruthenium (Ru), platinum (Pt), or iridium (Ir). The surface of the storage electrode 413 is covered with a capacitor insulating film 414 of $Ta_2O_5$ or the like.

A plate electrode 415 is formed on the capacitor insulating film 414, and they constitute an MIM capacitor.

The structure shown in FIG. 4B is obtained by removing an interlevel insulating film 411 in FIG. 4A and forming a convex capacitor structure (storage electrode 417, capacitor insulating film 418, and plate electrode 419) and a barrier film 416.

The platinum group metal includes six metals, i.e., ruthenium (Ru), rhodium (Rh), palladium (Pd), osmium (Os), iridium (Ir), and platinum (Pt). This embodiment can use any of these metals, but ruthenium, platinum, and iridium are especially preferable. The capacitor insulating film 414 can be formed from an oxygen-containing ferroelectric film such as a BST $((Ba_xSr_{1-x})TiO_3)$ film or PZT $(PbC(Zr_xTi_{1-x})O_3)$ film, in addition to the above-mentioned $Ta_2O_5$ metal oxide.

The storage electrode 413 is not limited to a convex shape, and may use a flat or pedestal-shaped electrode structure.

Details of the barrier film as a feature of the present invention will be explained with reference to FIGS. 5A to 5F.

FIGS. 5A to 5F show details of the barrier film in FIGS. 4A and 4B, and show examples of the barrier film. Any barrier film can prevent oxygen having permeated through the storage electrode from entering the lower structure, which can achieve the object of the present invention. FIGS. 5A to 5C show structures having only barrier films for inhibiting permeation of oxygen, and FIGS. 5D to 5F show structures obtained by nitriding the surfaces of $WSi_x$ layers in FIGS. 5A to 5C. The nitride layer can effectively inhibit silicide reaction between the metal material of the storage electrode and the $WSi_x$ layer. The structures in FIGS. 5A to 5F will be described in detail.

In FIG. 5A, the barrier film 412 or 416 is formed from a $WSi_x$ layer (tungsten silicide layer) on the storage electrode 413 or 417 side and a $WN_x$ layer (tungsten nitride layer) on the contact plug 410 side. By employing the two-layered structure, oxygen having permeated through the storage electrode 413 is consumed by reacting with the $WSi_x$ layer and forming a thin oxide film ($SiO_2$), and is inhibited from entering the lower structure. Further, the $WN_x$ layer formed below the $WSi_x$ layer can inhibit reaction between the contact plug and the $WSi_x$ layer. Note that x and y in the above and following compositions are independent for each molecule, and their values are arbitrarily set for each molecule even with the same symbols.

In FIG. 5B, the barrier film 412 or 416 is formed from a $WSi_x$ layer on the storage electrode 413 or 417 side and a $WSi_xN_y$ layer (tungsten silicon nitride layer) on the contact plug 410 side. This two-layered structure acts similarly to the structure of FIG. 5A, and can attain the same effects.

In FIG. 5C, the barrier film 412 or 416 is formed from only a $WSi_x$ layer. Even only the $WSi_x$ layer can be functioned as a barrier film by adjusting its film thickness.

In FIGS. 5D to 5F, the surfaces of the $WSi_x$ layers in FIGS. 5A to 5C are nitrided. The resultant nitride layers can prevent reaction between the storage electrode 413 or 417 and the $WSi_x$ layer in annealing and production of silicide at their interface. The $WSi_x$ layers in FIGS. 5A to 5F consume oxygen having permeated through storage electrodes by forming thin $SiO_2$ layers on the surfaces of the $WSi_x$ layers. At this time, if each $WSi_x$ layer contains W too much, a W oxide is produced before $SiO_2$ is produced, the volume increases, and problems such as peeling may occur. To prevent this, it is preferable that Si be richer than W. For example, $WSi_2$ is stable and contains W as a crystalline phase as less as possible.

Detailed manufacturing steps of the barrier film will be explained.

[A. $WSi_x$ (In-Situ Nitriding)+$WN_x$]

A wafer having a doped polysilicon contact plug is loaded into a processing chamber where the wafer temperature is increased to 500° C. and gas flow is executed in the following order.

(1) To deposit $WN_x$ with high adhesion properties, the partial pressure of tungsten hexafluoride ($WF_6$)=0.068 [Pa], and the partial pressure ratio of tungsten hexafluoride and ammonia (to be referred to as $WF_6/NH_3$ hereinafter)=0.002 are set.

(2) To deposit $WN_x$ with good step coverage, the $WF_6$ partial pressure=2.5 [Pa] and $WF_6/NH_3$=0.25 are set.

(3) To deposit $WSi_x$, the $WF_4$ partial pressure=0.16 [Pa], and the partial pressure ratio of tungsten hexafluoride and silane (to be referred to as $WF_6/SiH_4$ hereinafter)=0.05 are set.

Subsequently, nitriding by $NH_3$ post-flow is executed in the same processing chamber.

(4) To nitride the surface of the deposited $WSi_x$ film, the $NH_3$ partial pressure=173 [Pa] is set.

The materials of a storage electrode (Ru), capacitor insulating film ($Ta_2O_5$), and plate electrode (Au) are deposited and processed on the formed barrier film, thus completing an MIM capacitor structure. After the capacitor insulating film is formed, annealing is performed in an oxygen atmosphere ($O_2$ partial pressure=0.1 MPa) in order to improve the quality of the capacitor insulating film.

The electrical characteristics of the fabricated capacitor were measured to find that good characteristics were obtained with an oxide film thickness of 0.7 nm and a leakage current density of 2E-7 $A/cm^2$@1V. The barrier film including the interface with the Ru storage electrode after annealing was subjected to ESCA (Electron Spectroscopy for Chemical Analysis) to find that a heavily N-doped layer was formed on the surface of the $WSi_x$ layer and suppressed silicide reaction between the barrier film and the storage electrode, and that oxygen atoms stayed at a high density in the surface of the $WSi_x$ layer including the nitride layer and did not diffuse in the direction of depth of the barrier film. In other words, oxygen atoms were consumed by forming a thin $SiO_2$ layer on the surface of the $WSi_x$ layer on the barrier film, which suppressed further diffusion of oxygen atoms into the barrier film. The lower $WN_x$ layer of the barrier layer suppressed diffusion of Si between the contact plug and the barrier film, and prevented an increase in the resistance of the plug.

As the material of the contact plug, W can be used. In another case which doped polysilicon is used, the adhesion properties between the contact plug and the barrier film can be improved by flowing $WF_6$ gas at a partial pressure of 0.5 to 1 [Pa] before formation of the first $WN_x$ film. In addition, nitriding is preferably performed because when nitriding in step (4) is not performed, Si and Ru react on the surface of the barrier film to produce silicide, and the barrier film partially expands and swells. By properly adjusting the film formation conditions in steps (1) and (2), crystalline $W_2N$ can be obtained in the barrier film. This crystal structure is preferable because the heat resistance and peeling resistance are improved in comparison with an amorphous state. By properly adjusting the film formation conditions in step (3), the $WSi_x$ whose composition is Si>50 atm % (atomic percent) in the barrier film can be obtained. This structure can more preferably prevent peeling or an increase in resistance caused by production of $SiO_2$ before $WO_x$ is produced in annealing.

[B. $WSi_x$ (In-Situ Nitriding)+$WSi_xN_y$]

A wafer having a W contact plug is loaded into a processing chamber where the wafer temperature is increased to 450° C. and gas flow is executed in the following order.

(1) To deposit $WSi_xN_y$, $WF_6$, $NH_3$, and $SiH_4$ gases are alternately flowed 30 times by setting each partial pressure to 53 Pa. Gas is exhausted between the respective flows.

(2) To deposit $WSi_x$, the $WF_6$ partial pressure=0.16 [Pa] and $WF_6/SiH_4$=0.05 are set.

Nitriding is then performed by the $NH_3$ post-flow in the same processing chamber.

(3) To perform nitriding, the $NH_3$ partial pressure=173 [Pa] is set.

Then, the materials of a storage electrode (Ru), capacitor insulating film ($Ta_2O_5$), and plate electrode (Ru) are deposited and patterned on the formed barrier film, thus completing an MIM capacitor structure. After the capacitor insulating film is formed, annealing is performed in an oxygen atmosphere ($O_2$ partial pressure=0.1 MPa) in order to improve the quality of the capacitor insulating film.

The electrical characteristics of the fabricated capacitor were measured to find that good characteristics were obtained with an oxide film thickness of 0.8 nm and a leakage current density of 2E-7 $A/cm^2$@1V. The barrier film of this embodiment was excellent in step coverage and could maintain continuity and flatness even with a small film thickness. Miniaturization of a capacitor structure is particularly effective for fabrication of a cylinder structure at a high aspect ratio.

[C. $WSi_x$ (Ex-Situ Nitriding)+$WN_x$]

Steps up to formation of a contact plug, and barrier film formation steps (1) to (3) are executed similarly to [A]. The wafer is unloaded from the processing chamber and loaded into another chamber where the wafer temperature is increased to 650° C. and the following nitriding is done.

(4) Nitriding is performed by $NH_3$ annealing at room temperature.

The materials of a storage electrode (Ru), capacitor insulating film ($Ta_4O_5$), and plate electrode (Ru) are deposited and patterned on the nitride barrier film, thereby completing an MIM capacitor structure. After the capacitor insulating film is formed, annealing is performed in an oxygen atmosphere ($O_2$ partial pressure=0.1 MPa) in order to improve the quality of the capacitor insulating film.

The electrical characteristics of the fabricated capacitor were measured to find that good characteristics were obtained with an oxide film thickness of 0.75 nm and a leakage current density of 3E-7 $A/cm^2$@1V.

[D. $WSi_x$ (Ix-Situ Plasma Nitriding)+$WN_x$]

Steps up to formation of a contact plug, and barrier film formation steps (1) to (3) are executed similarly to [A]. The wafer undergoes plasma processing in an $NH_3$ atmosphere in the same processing chamber.

(4) Nitriding is performed at the $NH_3$ partial pressure=289 [Pa] and RF power=500 [W].

The nitriding plasma species may be $N_2$. The electrical characteristics of the capacitor were measured to find that good characteristics were obtained with an oxide film thickness of 0.7 nm and a leakage current density of 2E-7 $A/cm^2$@1V.

[E. $WSi_x$ (Ex-Situ Plasma Nitriding)+$WN_y$]

Steps up to formation of a contact plug, and barrier film formation steps (1) to (3) are executed similarly to [A]. The wafer is unloaded from the processing chamber and loaded into another chamber where the wafer temperature is increased to 450° C. and plasma processing is done in a $NH_3$ atmosphere.

(4) Nitriding is performed at the $NH_3$ partial pressure=289 [Pa] and RF power=500 [W].

The nitriding plasma species may be $N_2$. The electrical characteristics of the capacitor were measured to find that good characteristics were obtained with an oxide film thickness of 0.68 nm and a leakage current density of 2E-7 $A/cm^2$@1V.

[F. Film Formation Conditions of $WSi_x$ Layer]

The film formation conditions of the $WSi_x$ layers shown in FIGS. 5(a) to 5(f) will be described. The present inventors confirmed that a high-quality film could be formed under the following film formation conditions in forming a $WSi_x$ layer. If the substrate temperature is lower than 400° C., a satisfactory film formation temperature cannot be ensured; if the substrate temperature exceeds 650° C., $SiH_4$ vapor phase reaction progresses to generate particles. A preferable substrate temperature in film formation is 400° C. or more to 650° C. or less.

If the partial pressure ratio $WF_6/SiH_4$ is smaller than 0.02, a satisfactory film formation rate cannot be obtained owing to the supply rate-determining step of $WF_6$, and the step coverage degrades: if $WF_6/SiH_4$ exceeds 0.3, W is produced to degrade anti-oxidant action. Hence, a preferable partial pressure ratio $WF_6/SiH_4$ is 0.02 or more to 0.3 or less. If the $SiH_4$ partial pressure is less than 26 Pa, W is produced to degrade anti-oxidant action; if it exceeds 1 Torr, vapor phase reaction progresses to generate particles. A preferably $SiH_4$ partial pressure is 26 Pa or more to 133 Pa or less.

A series of steps in manufacturing the semiconductor devices shown in FIGS. 4A and 4B will be explained. A stacked memory cell will be exemplified.

FIGS. 6A to 6M show the steps in manufacturing the semiconductor device shown in FIG. 4A.

Figure 6A:
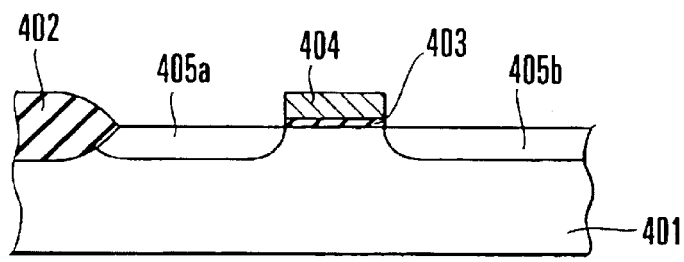
FIGS. 6A to 6M are sectional views, respectively, showing the steps in manufacturing a semiconductor device in FIG. 4A.

As shown in FIG. 6A, a gate electrode 404 is formed by a known method via a gate insulating film 403 in a region defined by a field oxide film 402 on a silicon substrate 401. After the gate electrode 404 is formed, source and drain regions 405a and 405b are formed by ion implantation or the like using the gate electrode 404 as a mask. In this case, the source and drain regions 405a and 405b may be exchanged.

Figure 6B:
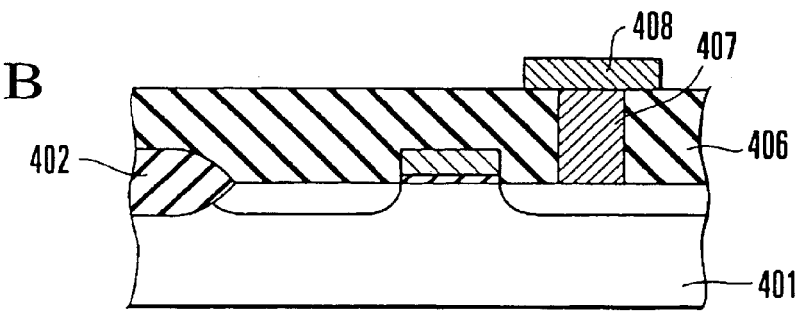

As shown in FIG. 6B, an interlevel insulating film 406 of an insulator such as silicon oxide is formed on the entire major surface of the silicon substrate 401. A contact hole is formed in the interlevel insulating film 406 in correspondence with the source or drain region 405a or 405b. Thereafter, a contact plug 407 and a bit line 408 connected to the contact plug 407 are formed.

Figure 6C:
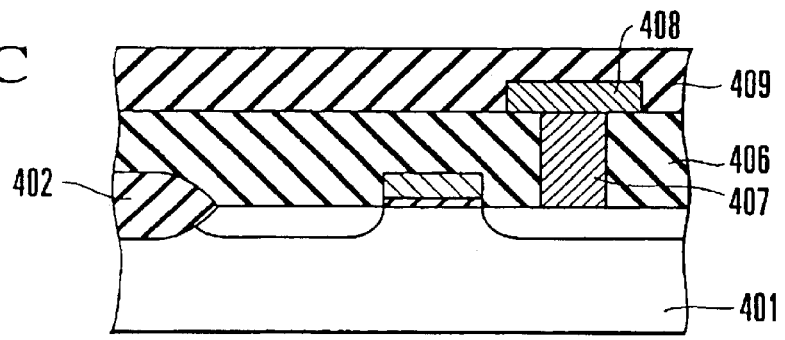

As shown in FIG. 6C, an interlevel insulating film 409 of an insulator such as silicon oxide is formed on the interlevel insulating film 406 including the bit line 408.

Figure 6D:
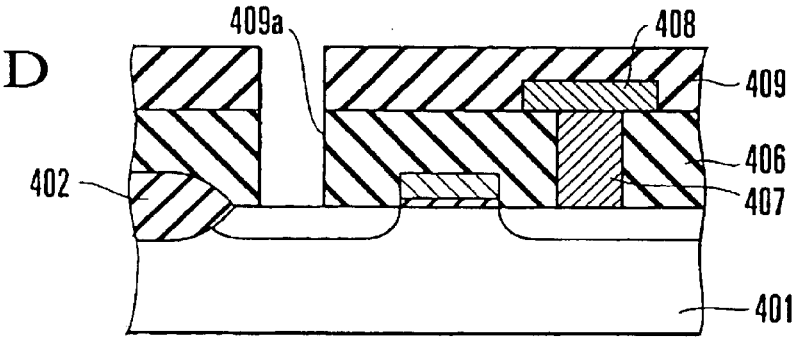

As shown in FIG. 6D, a contact hole 409a which reaches the source region 405a is formed in the interlevel insulating films 409 and 406 by known photolithography and etching (e.g., RIE (Reactive Ion Etching)).

Figure 6E:
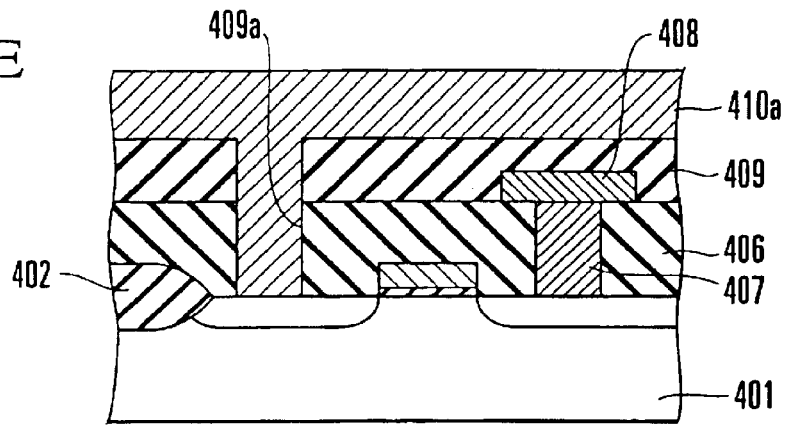

As shown in FIG. 6E, a doped polysilicon film 410a is formed by depositing doped polysilicon on the interlevel insulating film 409 by CVD so as to fill the contact hole 409a.

Figure 6F:
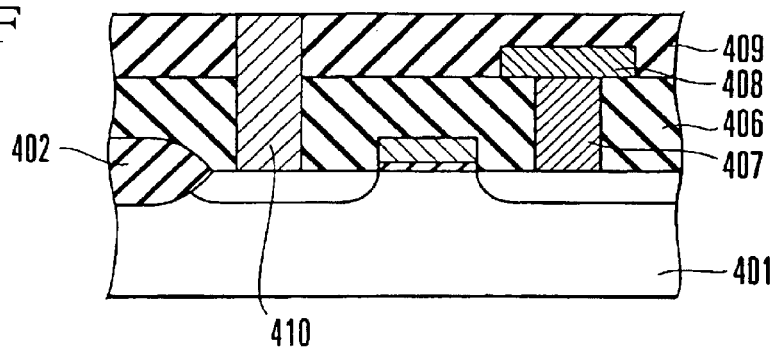

As shown in FIG. 6F, the doped polysilicon film 410a is removed by CMP to form a doped polysilicon contact plug 410 in the contact hole 409a.

Figure 6G:
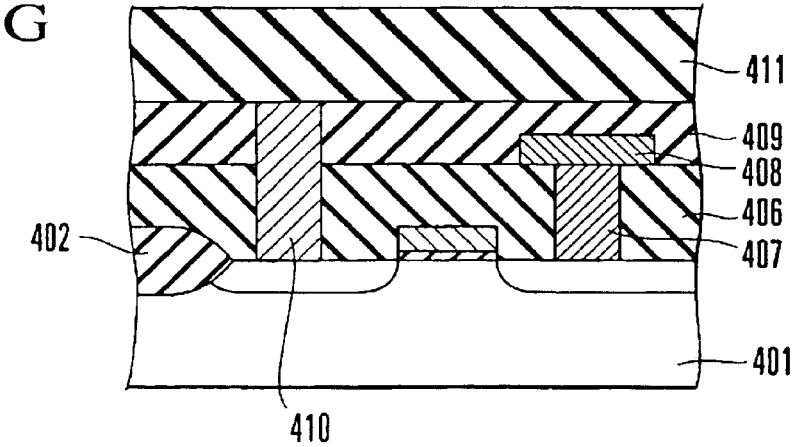
Figure 6H:
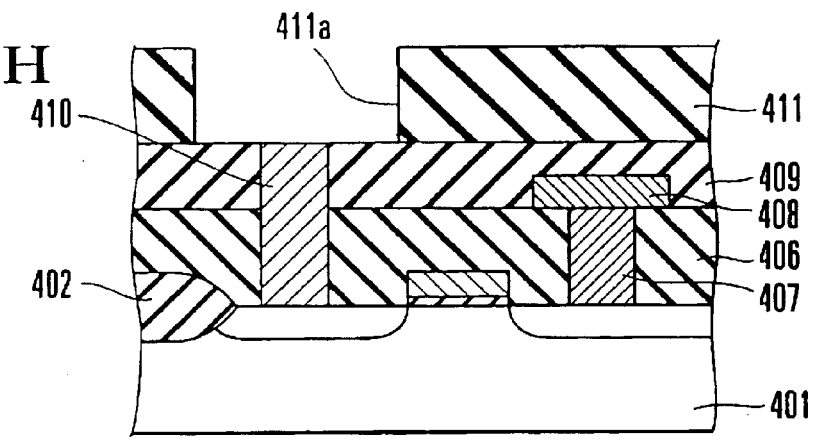

As shown in FIG. 6G, a silicon oxide interlevel insulating film 411 is formed on the entire major surface of the interlevel insulating film 409 including the contact plug 410. As shown in FIG. 6H, a via hole 411a which has the contact plug 410 as a center and is larger in diameter than the contact plug 410 is formed in the interlevel insulating film 411 by known photolithography and etching.

Figure 6I:
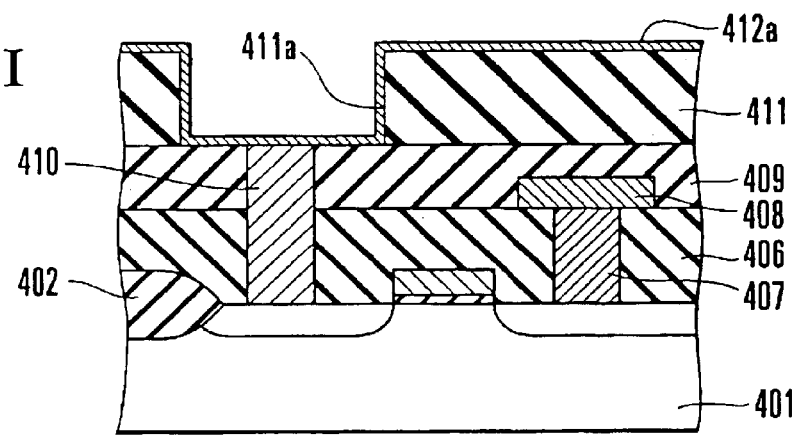

As shown in FIG. 6I, a barrier film material 412a is formed into a film so as to cover the surface of the interlevel insulating film 411 and the internal surface of the via hole 411a. The barrier film material 412a can be materials shown in FIGS. 5F to 5F. Any of a $WSi_x/WN_x$ two-layered structure, $WSi_x/WSi_xN_y$ two-layered structure, or a $WSi_x$ single-layered structure in FIGS. 5A to 5C can be employed, and such a layer can prevent oxidization of the contact plug 410. The present invention also incorporates $WSi_x$ layers having nitride surfaces, as shown in FIGS. 5D to 5F. The nitride layers can prevent reaction between storage electrodes 413 and 417 and the $WSi_x$ layer and production of silicide.

Figure 6J:
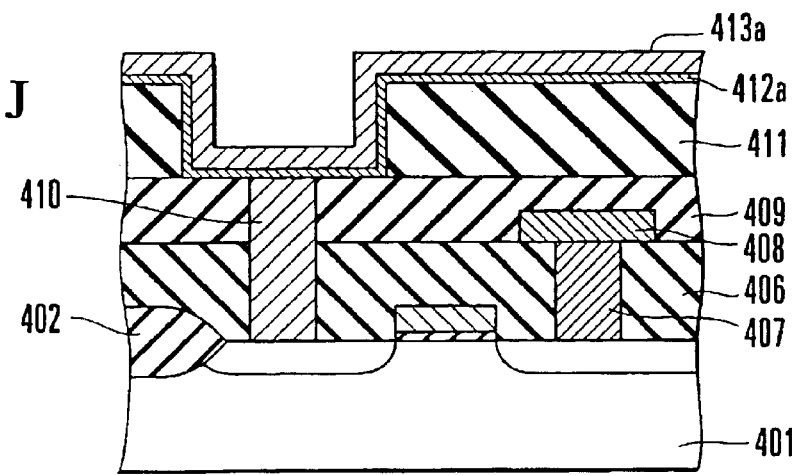
Figure 6K:
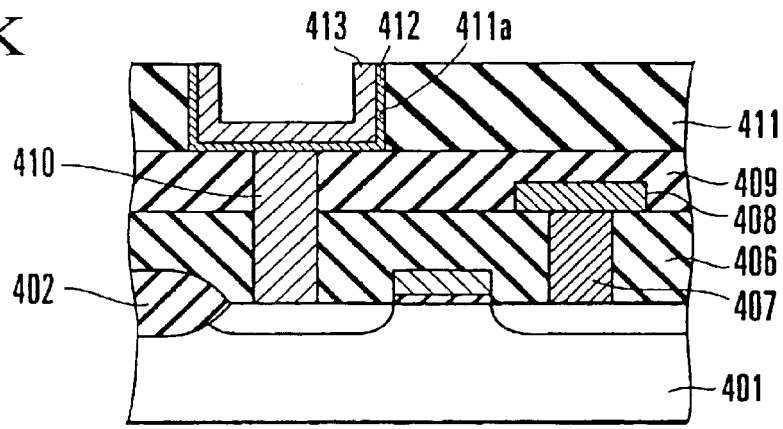

As shown in FIG. 6J, an Ru film 413a is formed by CVD or sputtering so as to cover the surface of the barrier film material 412a. As shown in FIG. 6K, the Ru film 413a and barrier film material 412a on the interlevel insulating film 411 are removed by CMP so as to leave them in only the via hole 411a. That is, the storage electrode 413 and barrier film 412 are completed.

Figure 6L:
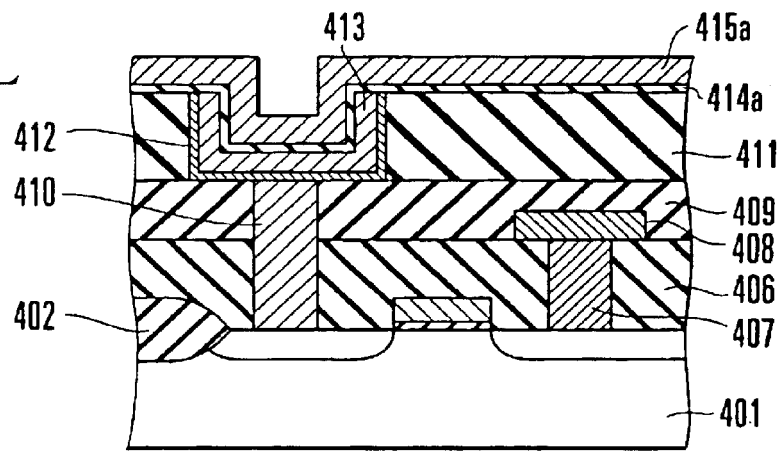
Figure 6M:
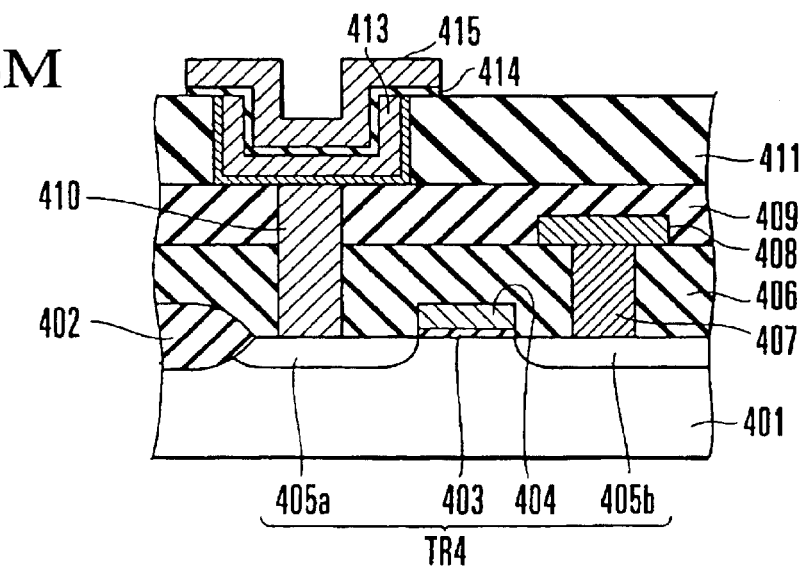

As shown in FIG. 6L, a $Ta_2O_5$ film 414a is formed by CVD so as to cover the entire wafer surface, and an Ru film 415a is formed on the $Ta_2O_5$ film 414a by CVD or sputtering. Unnecessary portions of these films are removed by known photolithography and etching to complete an MIM capacitor made up of the storage electrode 413, a capacitor insulating film 414, and a plate electrode 415.

Figure 7A:
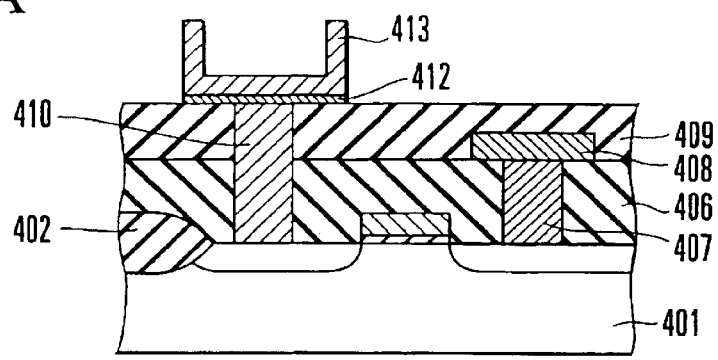
FIGS. 7A to 7C are sectional views, respectively, showing the steps in manufacturing a semiconductor device in FIG. 4B.
Figure 7B:
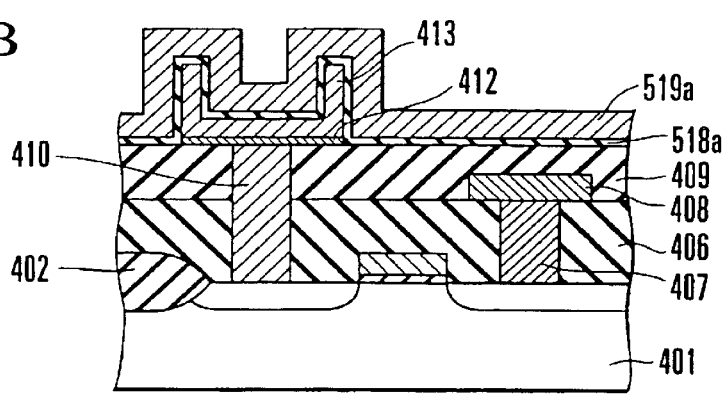
Figure 7C:
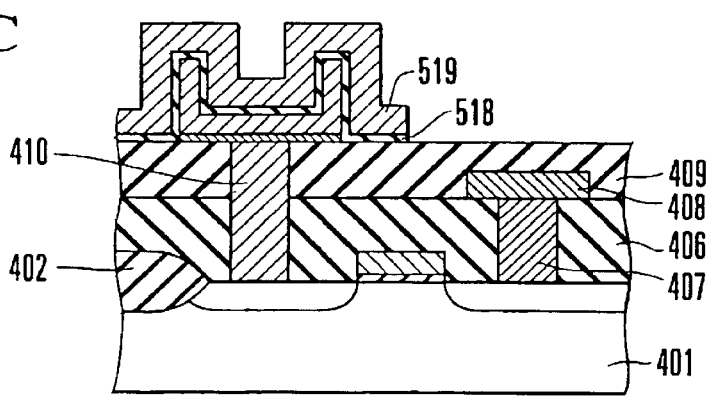

The capacitor structure shown in FIG. 4B is obtained as follows. The steps in FIGS. 6A to 6K among the steps in FIGS. 6A to 6M in manufacturing the structure of FIG. 4A are executed in the above-described manner. Then, the interlevel insulating film 411 is removed, as shown in FIG. 7A, and a $Ta_2O_5$ film 518a and Ru film 519a are formed, as shown in FIG. 7B. These films are processed into a capacitor insulating film 518 and plate electrode 519, as shown in FIG. 7C.

Figure 8A:
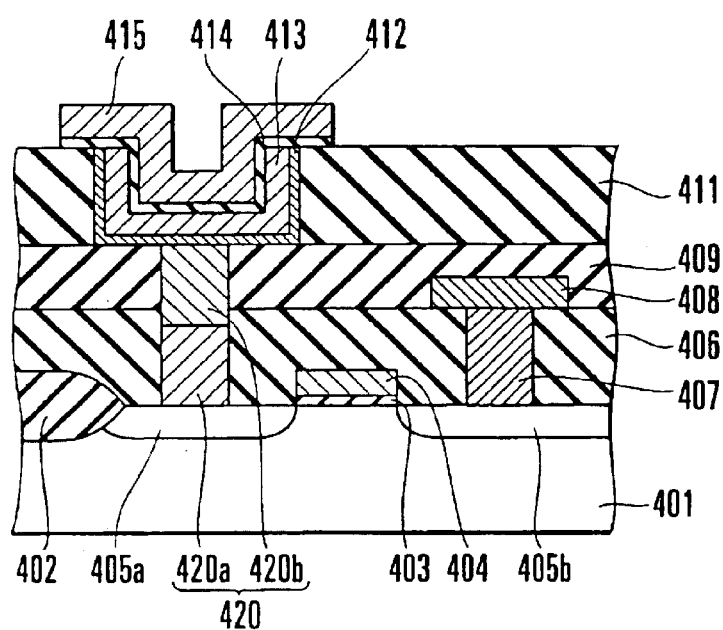
FIGS. 8A and 8B are sectional views each showing a modification using a W plug.
Figure 8B:
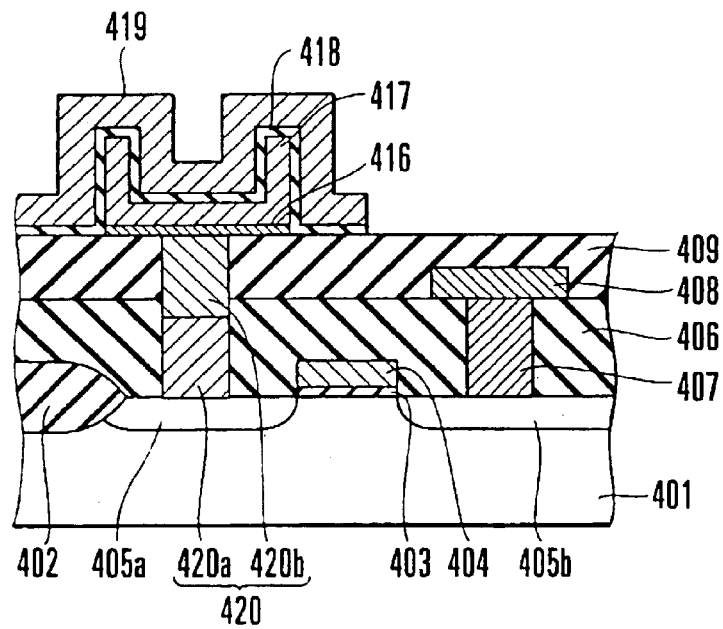

In the third embodiment, doped polysilicon is used as the material of the contact plug 410. However, the present invention is not limited to this and may use tungsten. When tungsten is used, a contact plug 420 is constituted by a lower contact plug 420a of doped polysilicon and an upper contact plug 420b of tungsten, as shown in FIGS. 8A and 8B in correspondence with FIGS. 4A and 4B. To form the contact plug from tungsten, tungsten is filled in a small contact plug hole. Since the burying properties of tungsten by thermal CVD are poor, the contact plug hole is filled to a certain level by doped polysilicon in advance, and the contact plug is constituted by two layers, as described above. The remaining structure in FIGS. 8A and 8B is the same as in FIGS. 4A and 4B.

When tungsten is used for the contact plug, the contact plug may adopt a three-layered structure of a lower tungsten nitride layer, intermediate tungsten layer, and upper tungsten silicide layer. Formation of the three-layered contact plug will be briefly described. After doped polysilicon is filled to a predetermined level in the contact hole, a tungsten nitride film, tungsten film, and tungsten suicide film serving as a barrier film are successively formed. In this case, the tungsten nitride film is inserted between the doped polysilicon film and the tungsten film in order to prevent an increase in resistance or a change in shape caused by reaction between doped polysilicon and tungsten. This intermediate tungsten nitride film may be omitted as far as the reaction can be suppressed to a negligible degree by appropriately setting the film formation temperature or the like. To the contrary, a tungsten nitride film may be inserted between the tungsten film and the tungsten silicide film in order to more strictly prevent diffusion of silicon in the tungsten silicide film into the tungsten film. The successively formed films are etched back by a predetermined amount by CMP or the like, thereby simultaneously forming a tungsten contact plug at the upper portion of the contact hole and a barrier film on the upper surface of the contact plug. Nitriding performed to prevent production of silicide caused by reaction between the storage electrodes 413 and 417 and the $WSi_x$ layer of the barrier film is effectively executed after etch-back. These methods can decrease the number of steps, compared to a case wherein a contact plug and barrier film are separately formed.

The tungsten contact plug and overlying barrier film can be simultaneously formed, but the barrier film does not cover the entire upper surface of the contact plug. In this case, the periphery of the upper surface of the contact plug is exposed without being covered with the barrier film. The barrier film need not cover the entire upper surface of the contact plug, and suffices to cover the upper surface of the contact plug to a certain degree, which can solve a problem caused by oxidizing the entire upper surface of the contact plug. For example, if the barrier film covers about 80% of the upper surface of the contact plug, a region below the barrier film is not oxidized, conductivity can be ensured, and swell caused by oxidization of the periphery of the contact plug can also be suppressed to a given degree. In the above description, $SiH_4$ (silane) is used for an Si source in forming an $WSi_x$ layer. However, the present invention is not limited to this and may employ $Si_2H_6$ (disilane), $SiH_2Cl_2$ (dichlorsilane). $SiHCl_3$ (trichlorsilane), or the like.

As described above, according to the third embodiment, a barrier film suppresses entry of oxygen into a contact plug. This embodiment attains excellent effects of suppressing formation of an oxide film on the surface of the contact plug after the barrier film is formed, and connecting a storage electrode and the contact plug at a low resistance.

The manufacturing method of the third embodiment can manufacture a semiconductor device in which the storage electrode and contact plug can be connected at a low resistance.

(Fourth Embodiment)

The fourth embodiment of the present invention will be described with reference to FIGS. 9A to 9K. A stacked memory cell will be exemplified.

Figure 9A:
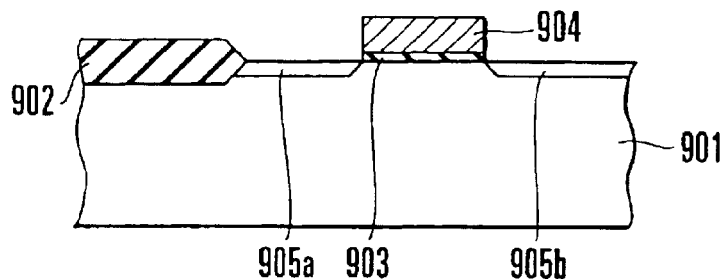
FIGS. 9A to 9K are sectional views, respectively, showing the steps in manufacturing a semiconductor device according to the fourth embodiment of the present invention.

As shown in FIG. 9A, a gate electrode 904 is formed by a known method via a gate insulating film 903 in a region partitioned by an element isolation region 902 on a silicon substrate 901. After the gate electrode 904 is formed, source and drain regions 905a and 905b are formed by ion implantation or the like using the gate electrode 904 as a mask. Note that the source and drain regions may be exchanged.

Figure 9B:
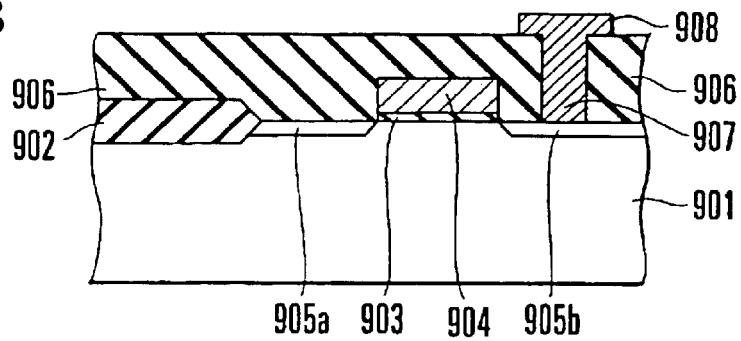

As shown in FIG. 9B, an interlevel insulating film 906 of an insulator such as silicon oxide is formed in the entire region of the silicon substrate 901. A contact plug 907 is formed at a predetermined position so as to connect it to the drain region 905b formed in the silicon substrate 901. A bit line 908 is formed and connected to the contact plug 907.

Figure 9C:
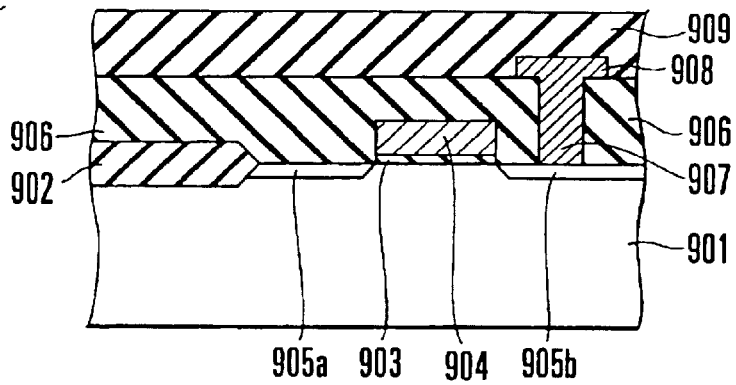
Figure 9D:
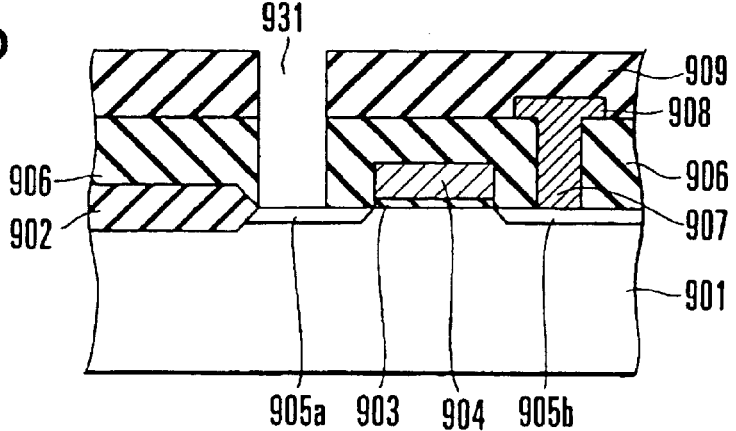

As shown in FIG. 9C, an interlevel insulating film 909 of an insulator such as silicon oxide is formed on the interlevel insulating film 906 including the bit line 908. As shown in FIG. 9D, a contact plug hole 931 is formed in the interlevel insulating films 909 and 906 by known photolithography and etching so as to reach the source region 905a.

Figure 9E:
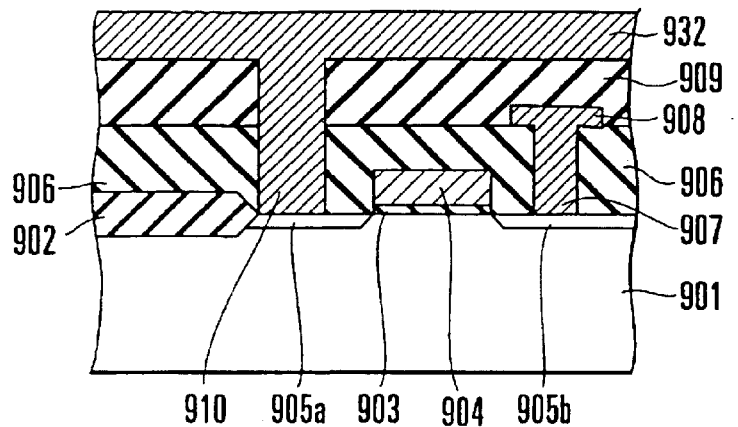

As shown in FIG. 9E, a doped polysilicon film 932 is formed by depositing doped polysilicon on the interlevel insulating film 909 so as to fill the contact plug hole 931. Deposition of the doped polysilicon film 932 uses, e.g., CVD.

Figure 9F:
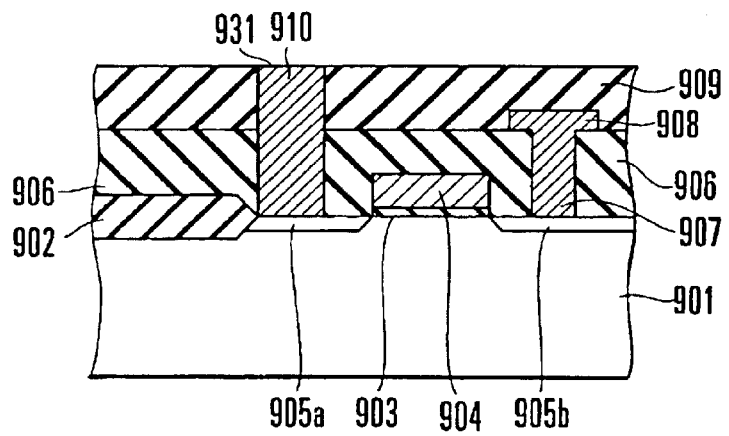

The doped polysilicon film 932 is selectively etched back to form a doped polysilicon contact plug 910 while the contact plug hole 931 is filled with doped polysilicon, as shown in FIG. 9F. Selective etch-back of the doped polysilicon film 932 adopts, e.g., CMP or reactive dry etching using an etching gas which has selectivity with respect to silicon and hardly etches the interlevel insulating film 906.

Figure 9G:
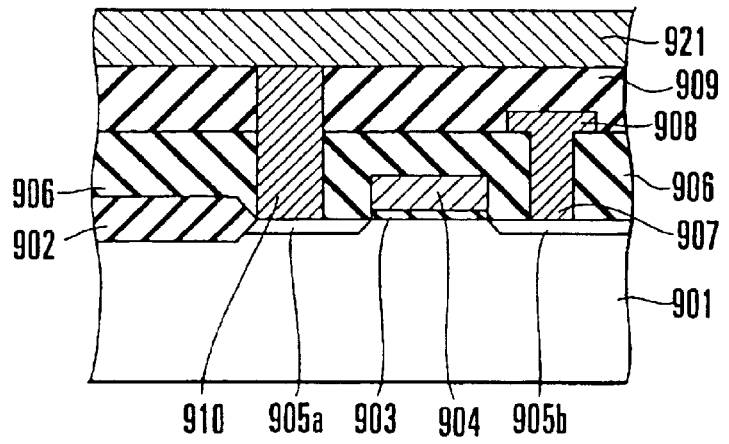

As shown in FIG. 9G, a tungsten nitride film 921 is deposited to a film thickness of about 10 to 50 nm on the interlevel insulating film 909 including the upper portion of the contact plug 910 by thermal CVD (Chemical Vapor Deposition). Formation of the tungsten nitride film 921 will be described. Pre-flow of supplying only tungsten source ($WF_6$) gas onto the interlevel insulating film 909 serving as a target surface heated to a predetermined temperature is performed in the initial stage. Then, nitrogen source ($NH_3$) gas is also supplied together with $WF_6$ gas to form the tungsten nitride film 921 on the interlevel insulating film 909. This pre-flow forms the tungsten nitride film 921 in tight contact with the upper surface of the contact plug 910.

Figure 9H:
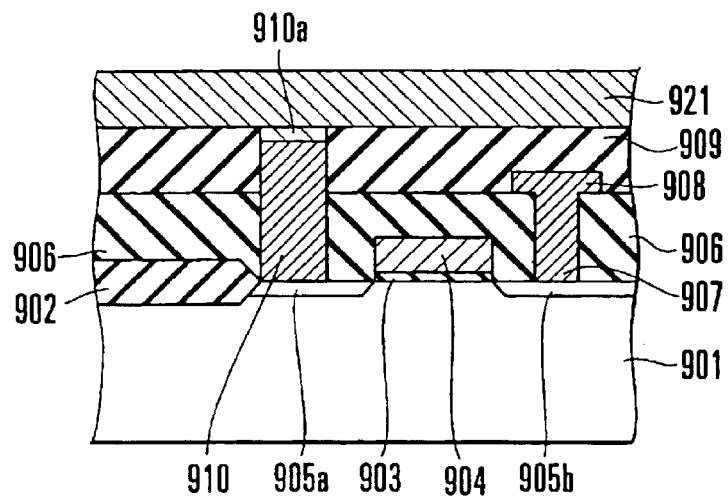

The silicon substrate 901 having the tungsten nitride film 921 is heated to 450° C. or more, the upper surface of the contact plug 910 reacts with the lower surface of the tungsten nitride film 921 that is in contact with this upper surface, and a tungsten silicon nitride (WSiN) barrier film 910a is formed on the contact plug 910, as shown in FIG. 9H. Heating is done within a temperature range in which each portion formed on the silicon substrate 901 does not melt.

After the barrier film 910a is formed at the interface by heating, the tungsten nitride film 921 is selectively removed by wet etching using, e.g., hydrogen peroxide. For example, an aqueous solution of $NH_4OH:H_2O_2:H_2O=1:1:10$ to $1:3:10$ is used as an etching solution. While this etching solution is heated to 50 to 70° C., the silicon substrate 901 is dipped in the etching solution for about 10 to 20 min. As a result, the tungsten nitride film 921 can be selectively etched. After being dipped in the etching solution, the target silicon substrate 901 is rinsed with pure water and dried.

Etching is substantially stopped when the upper surfaces of the interlevel insulating film 909 and barrier film 910a are exposed. This manufacturing method can form the barrier film 910a by self alignment. Note that removal of the tungsten nitride film 921 is not limited to wet etching using hydrogen peroxide, and may use any etching process capable of selectively removing the tungsten nitride film 921. For example, chemical mechanical polishing (CMP) or etch-back may be used as long as the tungsten nitride film 921 can be removed. Alternatively, most of the tungsten nitride film may be removed by CMP or etch-back, and etched and cleaned by wet etching using a hydrogen peroxide solution.

Figure 9I:
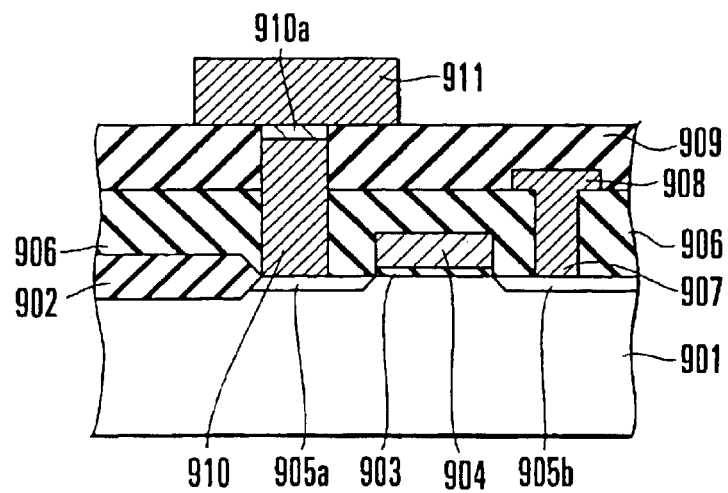

A ruthenium metal film is formed to a film thickness of 20 to 50 nm on the interlevel insulating film 909 including the barrier film 910a by sputtering, CVD, or the like. As shown in FIG. 9I, a storage electrode (first electrode) 911 connected to the contact plug 910 via the barrier film 910a is formed on the interlevel insulating film 909 by patterning the metal film by known photolithography and etching. Note that the storage electrode is not limited to ruthenium and may employ any metal material which exhibits conductivity even upon oxidization, or any metal material such as gold or platinum which hardly oxidizes.

Figure 9J:
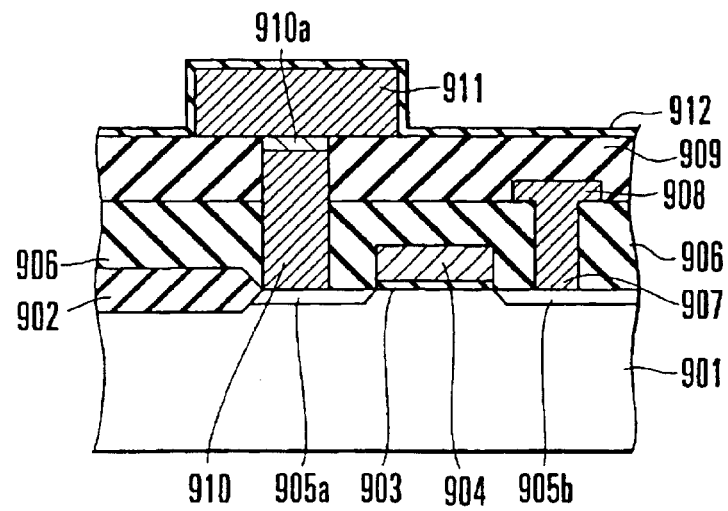

A tantalum oxide film is formed to a film thickness of about 5 to 15 nm on the interlevel insulating film 909 so as to cover the storage electrode 911, and undergoes post-processing such as annealing in an oxygen atmosphere at a temperature of about 500 to 750° C. Resultantly, a capacitor insulating film 912 is formed, as shown in FIG. 9J. Even if annealing in the oxygen atmosphere is performed, the fourth embodiment can suppress entry of oxygen into the surface of the contact plug 910 and can suppress oxidization because the WSiN barrier film 910a is on the contact plug 910.

Figure 9K:
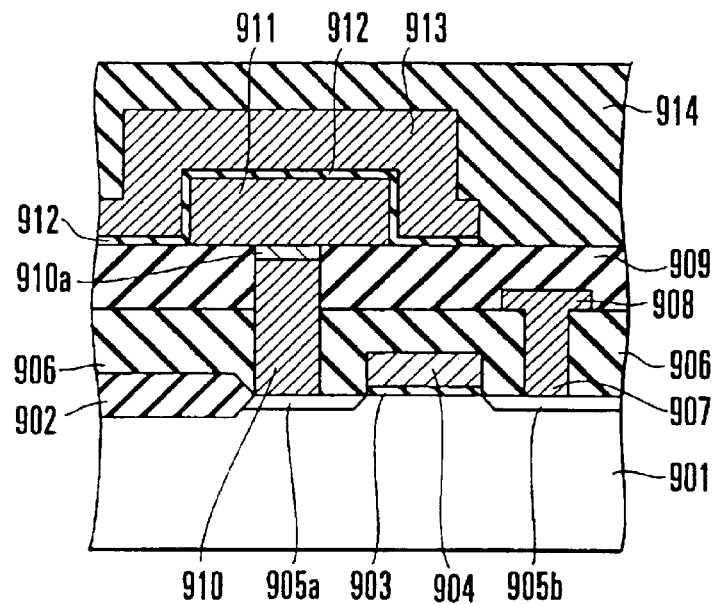
Figure 10:
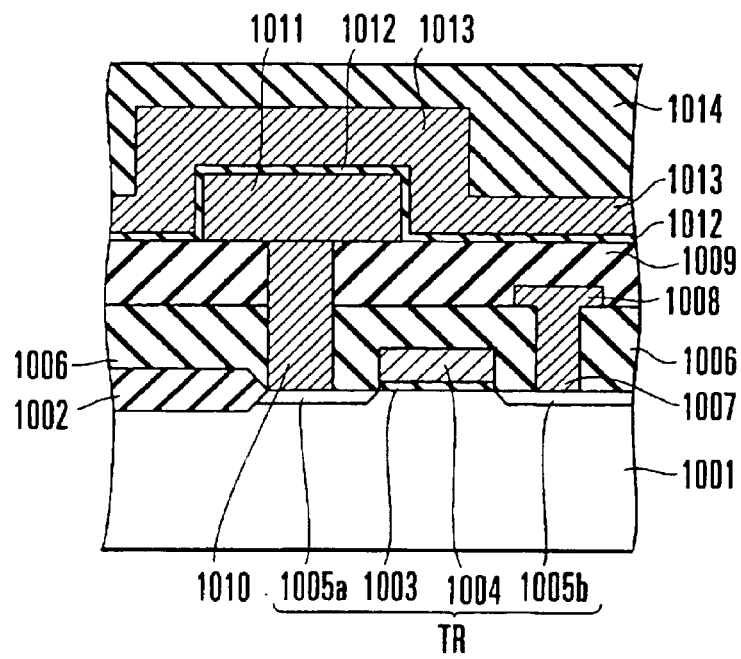
FIG. 10 is a schematic sectional view showing the structure of a conventional semiconductor device.

For example, a titanium nitride film or a ruthenium metal film is formed to a film thickness of about 10 to 100 nm on the capacitor insulating film 912. The formed metal film and the capacitor insulating film is patterned by known lithography and etching to form a plate electrode (second electrode) 913, as shown in FIG. 9K.

An interlevel insulating film 914 made of an insulating material such as a silicon oxide is formed to cover the plate electrode 913. A DRAM with one transistor and one capacitor is completed.

The capacitor electrode is flat in the fourth embodiment, but is not limited to this and may have a cylindrical shape or stacked electrode structure. For a cylindrical capacitor electrode, a plate electrode, capacitor insulating film, storage electrode, capacitor insulating film, and plate electrode (outside at the other terminal) are sequentially formed from the outside at one terminal in the lateral direction. The capacitor insulating film and plate electrode surround the storage electrode connected to the contact plug via the barrier film. For a stacked electrode structure, a lowermost storage electrode connected to a contact plug via a barrier film may be extracted to the uppermost layer of the memory cell via a surrounding electrode. The capacitor insulating film is not limited to tantalum oxide and may use another metal oxide such as BST or PZT.

As described above, according to the fourth embodiment, a barrier film made from tungsten, silicon, and nitrogen suppresses entry of oxygen into a contact plug. The fourth embodiment realizes excellent effects of suppressing oxidation of the surface of the contact plug after the barrier film is formed, and suppressing a decrease in adhesion properties at the interface with the storage electrode. According to the present invention, the barrier film can be easily formed.

What is claimed is:

1. A semiconductor device manufacturing method comprising the steps of:

forming an interlevel insulating film on a semiconductor substrate;

forming a contact plug from a conductive material so as to extend through the interlevel insulating film;

forming a barrier film so as to cover the contact plug exposed from the interlevel insulating film;

forming a first electrode from a metal material on the interlevel insulating film so as to be connected to the contact plug via the barrier film;

forming a capacitor insulating film from an insulating metal oxide on the first electrode; and forming a second electrode on the capacitor insulating film, wherein the barrier film is formed from at least two layers, one layer of which is formed from WN, and the remaining layer is a film formed on the WN layer and includes Si and at least one chosen from either W or N, wherein the barrier film is formed by forming the tungsten nitride film and then forming a silicon nitride film on the tungsten nitride film by thermal chemical vapor deposition using nitrogen source gas and silicon source gas, and wherein the barrier film is formed from a first tungsten nitride thin film and a second silicon nitride thin film formed on the first thin film.

2. A semiconductor device manufacturing method comprising the steps of:

forming an interlevel insulating film on a semiconductor substrate;

forming a contact plug from a conductive material so as to extend through the interlevel insulating film;

forming a barrier film so as to cover the contact plug exposed from the interlevel insulating film;

forming a first electrode from a metal material on the interlevel insulating film so as to be connected to the contact plug via the barrier film;

forming a capacitor insulating film from an insulating metal oxide on the first electrode; and forming a second electrode on the capacitor insulating film, wherein the barrier film is formed from at least two layers, one layer of which is formed from WN, and the remaining layer is a film formed on the WN layer and includes Si and at least one chosen from either W or N, wherein the barrier film is formed by forming the tungsten nitride film and then forming a tungsten silicide film on the tungsten nitride film by thermal chemical vapor deposition using tungsten source gas and silicon source gas, wherein the barrier film is formed from a first tungsten nitride thin film and a second tungsten silicide thin film formed on the first thin film, wherein tungsten silicide is formed by setting a substrate temperature to not less than 400° to not more than 650°, setting a partial pressure ratio $WF_6SiH_4$ of tungsten hexafluoride and silane to not less than 0.02 to not more than 0.3, and setting a silane $SiH_4$ partial pressure to not less than 26 Pa to not more than 133 Pa.

3. A semiconductor device manufacturing method comprising the steps of:

forming an interlevel insulating film on a semiconductor substrate;

forming a contact plug from doped polysilicon so as to extend through the interlevel insulating film;

forming a tungsten nitride film on the interlevel insulating film including an upper surface of the contact plug by thermal chemical vapor deposition using tungsten source gas and nitrogen source gas;

heating the semiconductor substrate having the tungsten nitride film to not less than 450° C. and forming a barrier film from tungsten nitride and silicon so as to cover the surface of the contact plug;

removing the tungsten nitride film after forming the barrier film;

forming a first electrode from a metal material on the interlevel insulating film so as to be connected to the contact plug via the barrier film;

forming a capacitor insulating film from an insulating metal oxide on the first electrode; and forming a second electrode on the capacitor insulating film.

4. A method according to claim 3, wherein the tungsten nitride film is removed by wet etching using hydrogen peroxide.

5. A method according to claim 3, wherein the tungsten nitride film is formed by supplying only tungsten source gas onto a tungsten nitride film formation surface in an initial stage and then supplying nitrogen source gas together with the tungsten source gas.

6. A semiconductor device manufacturing method comprising the steps of:

forming an interlevel insulating film on a semiconductor substrate;

forming a contact plug from a conductive material so as to extend through the interlevel insulating film;

forming a barrier film so as to cover the contact plug exposed from the interlevel insulating film;

forming a first electrode from a metal material on the interlevel insulating film so as to be connected to the contact plug via the barrier film;

forming a capacitor insulating film from an insulating metal oxide on the first electrode; and forming a second electrode on the capacitor insulating film, wherein the barrier film is formed from at least two layers, one layer of which is formed from WN, and the remaining layer is a film formed on the WN layer and includes Si and at least one chosen from either W or N, wherein the remaining layer includes SiWN.

* * * * *